US 6,466,447 B2

(12) United States Patent
Murowaki et al.

(10) Patent No.: US 6,466,447 B2
(45) Date of Patent: Oct. 15, 2002

(54) ELECTRONIC CONTROL UNIT HAVING FLEXIBLE WIRES CONNECTING CONNECTOR TO CIRCUIT BOARD

(75) Inventors: Toru Murowaki, Chiryu; Toshiaki Yagura, Nukata-gun; Fujio Sahara, Kosai; Kazuya Sanada; Taku Iida, both of Kariya; Minoru Hozuka, Okazaki, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/768,050

(22) Filed: Jan. 24, 2001

(65) Prior Publication Data

US 2001/0017766 A1 Aug. 30, 2001

(30) Foreign Application Priority Data

| Feb. 24, 2000 | (JP) | 2000-047566 |
| Mar. 31, 2000 | (JP) | 2000-098068 |
| Mar. 31, 2000 | (JP) | 2000-098069 |

(51) Int. Cl.[7] .............................. H05K 7/14; H05K 1/11
(52) U.S. Cl. .................. 361/752; 361/728; 361/736; 361/758; 361/784; 361/801; 439/76.2
(58) Field of Search .................. 361/687, 688, 361/704, 707, 728, 736, 737, 752, 796, 797, 801, 784–791, 758; 439/76.2

(56) References Cited

U.S. PATENT DOCUMENTS

| 4,811,165 A | * | 3/1989 | Currier et al. ............... 361/714 |
| 5,362,243 A | * | 11/1994 | Huss et al. .................... 439/76 |
| 5,408,383 A | | 4/1995 | Nagasaka et al. |
| 5,478,244 A | * | 12/1995 | Maue et al. ................ 439/76.2 |
| 5,519,252 A | | 5/1996 | Soyano et al. |
| 5,563,771 A | * | 10/1996 | Bethurum ..................... 361/737 |
| 5,735,697 A | * | 4/1998 | Muzslay ....................... 439/83 |
| 5,959,839 A | * | 9/1999 | Gates .......................... 361/704 |
| 6,341,066 B1 | | 1/2002 | Murowaki et al. ........... 361/707 |

FOREIGN PATENT DOCUMENTS

| JP | 1-147850 | 6/1989 |
| JP | 6-21330 | 1/1994 |

OTHER PUBLICATIONS

U.S. patent application Ser. No. 09/739,961, Sanada et al., filed Dec. 20, 2000.

* cited by examiner

Primary Examiner—Jayprakash N. Gandhi
(74) Attorney, Agent, or Firm—Law Offices of David G. Posz

(57) ABSTRACT

In an electronic control unit for controlling operation of various devices, a circuit board carrying electronic components thereon and a connector for connecting the control unit to outside devices are electrically connected through a flexible printed-circuit sheet. A casing of the control unit is designed to contain therein a circuit board selected from variously sized circuit boards. The circuit board may be functionally divided into a certain number of circuit boards. Some varieties of each functionally divided circuit board are prepared, and circuit boards meeting a particular requirement are selected from the varieties and used in a control unit. Thus, the electronic control units meeting various requirements are efficiently and economically manufactured.

23 Claims, 16 Drawing Sheets

219

210

FIG. 9A
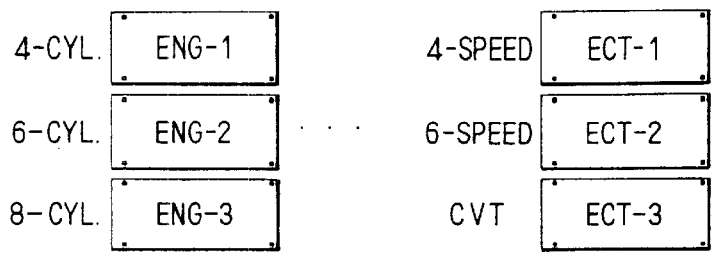
FIG. 9B
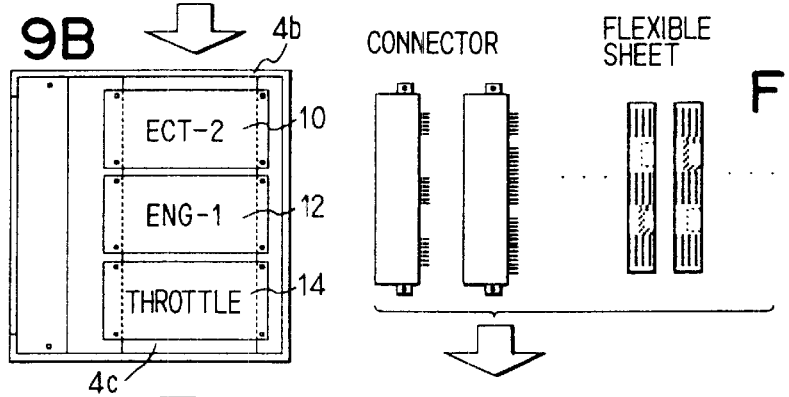
FIG. 9C
FIG. 9D
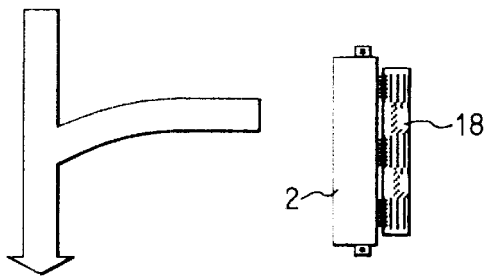
FIG. 9E
FIG. 9F
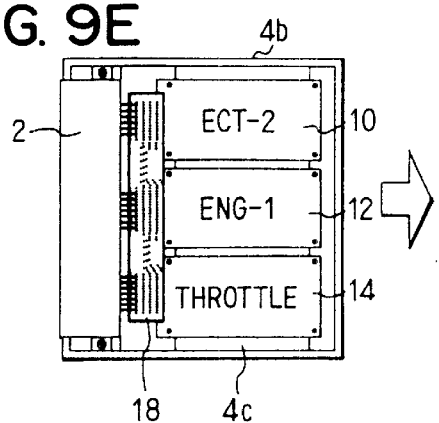
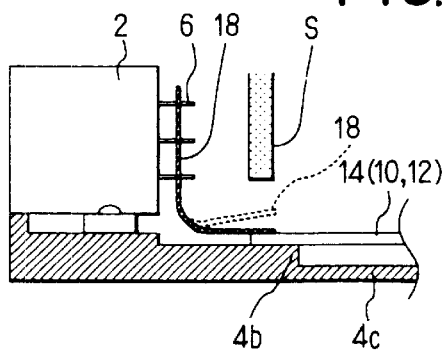

ELECTRONIC CONTROL UNIT HAVING FLEXIBLE WIRES CONNECTING CONNECTOR TO CIRCUIT BOARD

CROSS-REFERENCE TO RELATED APPLICATIONS

This application is based upon and claims benefit of priority of Japanese Patent Applications No. 2000-47566 filed on Feb. 24, 2000, No. 2000-98068 filed on Mar. 31, 2000 and No. 2000-98069 filed on Mar. 31, 2000, the contents of which are incorporated herein by reference.

BACKGROUND OF THE INVENTION

1. Field of the Invention

The present invention relates to an electronic control unit having a connector electrically connecting the unit to outside devices and a circuit board on which driving elements and control elements are mounted, and more particularly to such an electronic control unit in which the connector and the circuit board are connected to each other through flexible wires.

2. Description of Related Art

Electronic control units for controlling operation of outside devices based on signals fed to and processed in the control units are generally known. An example of such electronic control units is briefly shown in FIGS. 17A and 17B (FIG. 17A shows an cross-sectional view, and FIG. 17B shows a plan view with an upper plate removed). In this example, a circuit board 40, on which various components such as control elements 53, driving elements 55 and passive elements 57 are mounted, and a connector 51 connecting the control unit to outside devices such as actuators and sensors are contained in a casing consisting of an upper case 50a and a lower case 50b. A plurality of connector pins 51a are inserted into through-holes 40a of the circuit board 40 and electrically connected to the circuit board 40.

Another example of conventional electronic control units for use in an automobile vehicle is briefly shown in FIG. 18. In this example, a circuit board 930 and a connector 935 are contained in a casing 938, and the connector pins 935a are inserted into the circuit board 930 and electrically connected thereto. An I/O circuit 934 having components 936, an ECT control circuit 932 for electronically controlling a transmission device, an ENG control circuit 933 having components 937 for controlling operation of an engine, and a throttle control circuit 931 for controlling operation of a throttle valve are all mounted on a single circuit board 930.

There are following problems in both types of conventional electronic control units. When the connector 51 or 935 is changed to another one in order to connect the control unit to different outside devices, an entire circuit board 40 or 930 has to be redesigned even if its function is not changed, because the connector pins are inserted into the circuit board having a circuit pattern printed thereon. The number of connector pins, the shape of the connector or the alignment of the connector pins have to be changed according to the outside devices to be connected to the control unit. In other words, plural circuit boards have to be prepared for matching various connectors even if the function of the circuit board is not changed. In addition, the size of the circuit board has to correspond to the size of the connector to accommodate the connector pins therein, even if a smaller circuit board is enough to cover a required function. In the conventional example shown in FIG. 18, which includes several control circuits in a single circuit board 930, an entire circuit board must be redesigned to change one of the control functions. All of the foregoing situations result in a higher cost in manufacturing the control unit.

SUMMARY OF THE INVENTION

The present invention has been made in view of the above-mentioned problems, and an object of the present invention is to provide an improved electronic control unit in which the design of the circuit board is standardized and simplified. Another object of the present invention is to provide an improved manufacturing method of such an electronic control unit.

The electronic control unit of the present invention is used for controlling operation of various devices. For example, the control unit is mounted on an automobile to control operation of an engine, a transmission device, a throttle valve and other devices. The electronic control unit is composed of a casing, a circuit board on which various electronic components such as transistors and microcomputers are mounted, a connector for electrically connecting the control unit to outside devices and flexible wires such as a flexible printed-circuit sheet connecting the connector and the circuit board. All those components are contained in a single casing. Various signals fed to the control unit from outside devices including sensors are processed in the control unit, and outputs for controlling the outside devices are generated in the control unit based on the processed signals.

The connector and the circuit board are not directly connected but are indirectly connected through the flexible printed-circuit sheet. Accordingly, if the connector is replaced with another type to match outside devices, it is not necessary to redesign the entire circuit board. Further, the casing is designed to be able to mount thereon variously sized circuit boards. Therefore, a circuit board having a desired function is selectively mounted on the same casing. For this purpose, surfaces for supporting variously sized circuit boards may be formed in the casing, or the supporting surfaces may be formed in steps so that each step can support a differently sized circuit board. Further, heat-generating components such as power transistors mounted on the circuit board may be disposed in the casing in contact with a heat-dissipation wall formed in the casing to quickly dissipate the generated heat.

The electronic control unit is assembled in the following manner. First, the circuit board carrying various components thereon and the connector are respectively mounted on the casing. Then, the connector and the circuit board are electrically connected through the flexible printed-circuit sheet. Preferably, one end of the flexible printed-circuit sheet is soldered to the connector before the connector is mounted on the casing, and then the other end of the flexible sheet is soldered to the circuit board after the connector is mounted on the casing. The other end of the flexible sheet is soldered to the circuit board, preferably, at a position where the circuit board is supported by the casing to avoid deformation of the circuit board. Thus, the control unit is efficiently assembled in a simple manner.

The circuit board may be divided into several circuit boards, each corresponding to a respective object to be controlled, e.g., a transmission device, an engine and a throttle valve. Alternatively, the circuit board may be divided into several circuit boards by function, e.g., a circuit board for handling input signals, a circuit board for processing signals and a circuit board for generating outputs. A certain number of variations for each functionally divided circuit board are prepared to cover various requirements, and circuit. boards meeting a particular requirement are selectively mounted on the casing. In this manner, control units meeting a variety of requirements are efficiently manufactured without making major changes in the entire unit.

A signal alignment board having a printed circuit pattern thereon may be interposed between the connector and the flexible sheet, so that the connector and the circuit board are electrically connected through the signal alignment board and the flexible sheet. Circuit crossovers in a circuit pattern formed in the flexible sheet are eliminated by using the signal alignment board. Further, noise-absorbing elements for eliminating noise fed into the control unit from outside may be mounted on the signal alignment board, thereby eliminating other noise-absorbing elements mounted on individual circuit boards.

According to the present invention, the design of the circuit board is standardized, and the electronic control units meeting a variety of requirements are efficiently manufactured at a low cost.

Other objects and features of the present invention will become more readily apparent from a better understanding of the preferred embodiments described below with reference to the following drawings.

BRIEF DESCRIPTION OF THE DRAWINGS

FIGS. 9A–9F are drawings showing a process of assembling the fourth embodiment;

DETAILED DESCRIPTION OF THE PREFERRED EMBODIMENTS

Figure 1A:
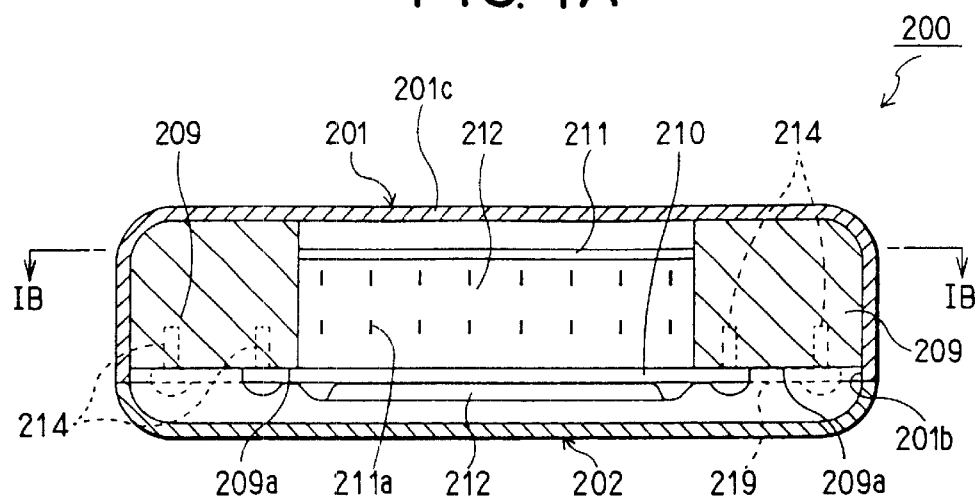
FIG. 1A is a cross-sectional view showing an electronic control unit as a first embodiment of the present invention, taken along line IA—IA of FIG. 1B.
Figure 1B:
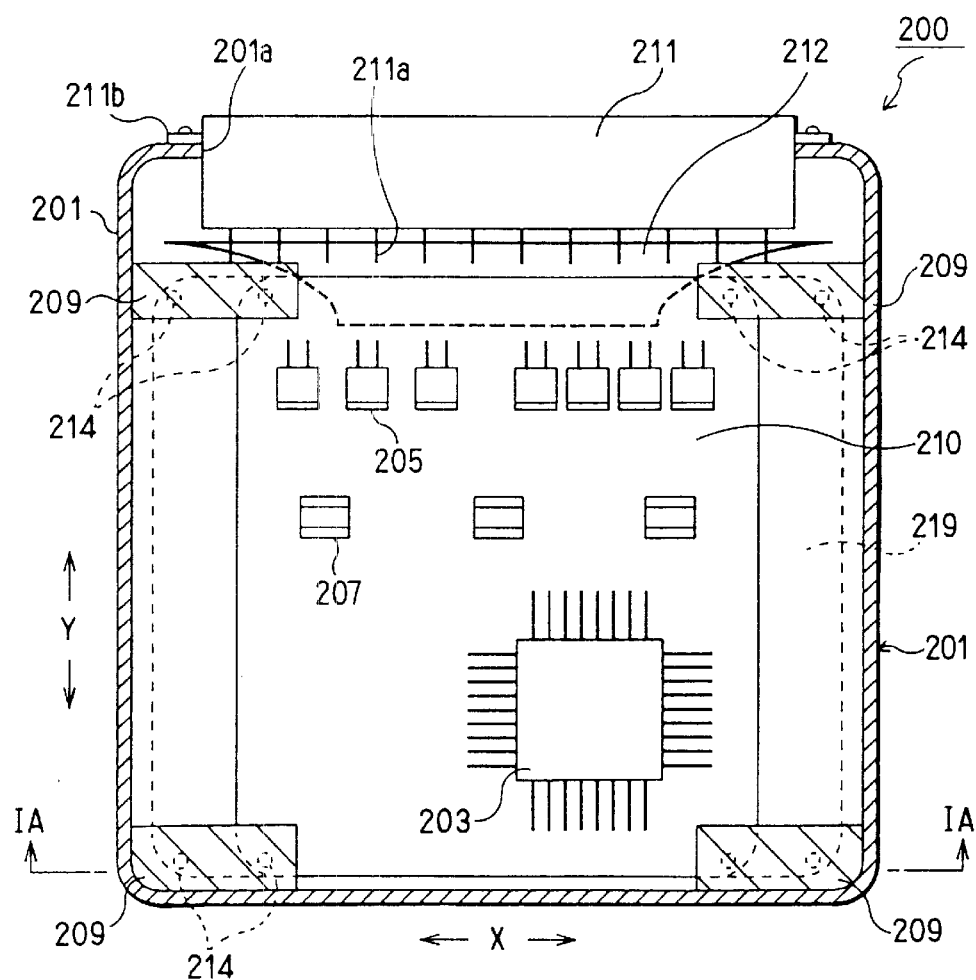
FIG. 1B is a cross-sectional view showing the first embodiment, taken along line IB—IB of FIG. 1A.

A first embodiment of the present invention will be described with reference to FIGS. 1A–3B. First, referring to FIGS. 1A and 1B, the structure of an electronic control unit 200 as the first embodiment will be described. FIG. 1A shows a cross-sectional view, but electronic components contained therein are omitted to simplify the drawing. FIG. 1B shows the control unit 200, viewed from its top with its upper plate removed. The control unit 200 is for use in an automobile vehicle. It controls operation of automobile actuators (not shown) such as spark plugs and electromagnetic solenoids, based on various signals fed to the control unit 200 from outside sensors (not shown) and processed therein. For example, an engine, a transmission device and/or a braking system are controlled by the control unit 200.

The control unit 200 is composed of a casing, a circuit board 210 and connector 211 both contained in the casing. The casing consists of an upper case 201 and a lower case 202 fixed to the upper case 201. The connector 211 includes plural connector pins 211a and flange 211b for fixing the connector 211 to the upper case 201. The connector 211 electrically connects the control unit 200 to the outside sensors and actuators. The circuit board 210 is made of a resin board such as epoxy-impregnated glass cloth, and control circuits are formed thereon. Control elements 203 such as a microcomputer, driving elements 205 such as power transistors, and passive elements 207 such as resistors and capacitors are mounted on the circuit board 210 and electrically connected to circuits on the circuit board 210.

The control elements 203 are composed of a one-chip microcomputer that receives signals (e.g., signals indicating operating conditions of the engine) from the sensors connected to the control unit 200 through the connector 211. The signals fed to the microcomputer are processed therein to generate control signals to be supplied to the driving elements 205. The control elements 203 also perform communication with electrical components mounted on the automobile through the connector 211.

The connector pins 211a of the connector 211 are electrically connected to the circuit board 210 through a flexible printed-circuit sheet 212 (also referred to as a flexible sheet) The flexible sheet 212 is resilient and absorbs vibration imposed thereon. One end of the flexible sheet 212 is soldered to the connector pins 211a, and the other end is soldered to the circuit pattern formed on the circuit board 210. The flexible sheet 212 is disposed in the casing, being bent with a certain allowance not to contact walls of the casing when vibrated.

The upper and lower cases 201, 202 are made of a metallic material such as cast aluminum. The upper case 201 is cup-shaped and includes an upper wall 201c, a sidewall and a bottom opening 201b. A side opening 201a is formed on the sidewall to insert the connector 211 therethrough. The flange 211b of the connector 211 is fixed to the upper case 201 by screws. The connector may be fixed to the upper case 201 with adhesive, not by the screws. Four stays 209 for supporting the circuit board 210 thereon are formed integrally with the upper case 201 at its corners as shown in FIG. 1B. The circuit board 210 is supported on the supporting surfaces 209a of the stays 209, forming a space between the upper wall 201c and the circuit board 210.

Each stay 209 has a rectangular shape, and the long side thereof lies in parallel to the longitudinal direction of the connector 211 (direction X in FIG. 1B). Two screw holes 214 are formed on each supporting surface 209a along the direction X. More than two screw holes may be made in the same manner if necessary. The circuit board 210 is fixed to the supporting surface 209a by screws screwed into inner screw holes 214, as shown with a solid line in FIG. 1B. The circuit board 210 may be replaced with a larger circuit board 219, when required, and the larger circuit board 219 is supported on the supporting surface 209a by screws screwed into outer screw holes 214, as shown with a dotted line. After the circuit board 210 or 219 is mounted, the bottom opening 201b is closed with the lower case 202.

Figure 2A:
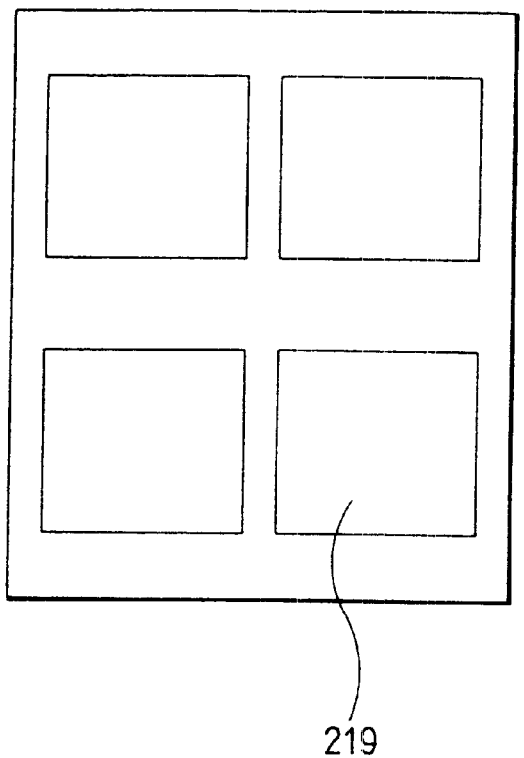
FIG. 2A is a schematic plan view showing a plate from which four boards are cut out.
Figure 2B:
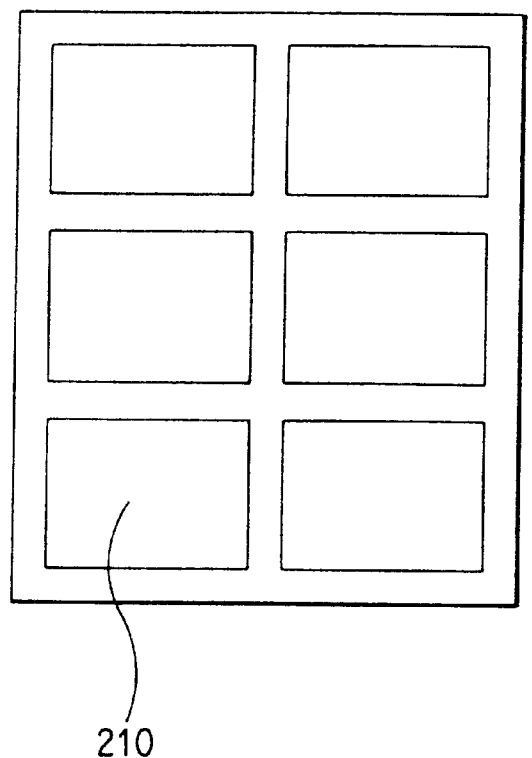
FIG. 2B is a schematic plan view showing a plate from which six boards are cut out.

The circuit boards 210 and 219 are so made that their sides along the X direction vary, while keeping their sides along the Y direction constant. In other words, the circuit boards having different sizes in the X direction (width) and having the same size in the Y direction (length) can be accommodated in the same casing. As shown in FIGS. 2A and 2B, if large circuit boards 219 are required, four circuit boards are punched out from one plate, while six circuit boards are punched out from the same plate if the small circuit boards 210 are required. Only the width is changed while keeping the length constant.

The assembling process of the electronic control unit 200 will be described with reference to FIGS. 3A and 3B. First, all the components including the control elements 203, the driving elements 205 and the passive elements 207 are mounted on and electrically connected to the circuit pattern formed on the circuit board 210. Then, the circuit board 210 is fixed to the supporting surfaces 209 by screws. On the other hand, the flexible printed-circuit sheet 212 is electrically connected to the connector pins 211a by inserting the connector pins 211a into the holes formed in the circuit pattern of the flexible sheet 212 and by soldering both together. Then, the connector 211 is inserted into the side opening 201a of the upper casing 201 and is fixed thereto.

Figure 3A:
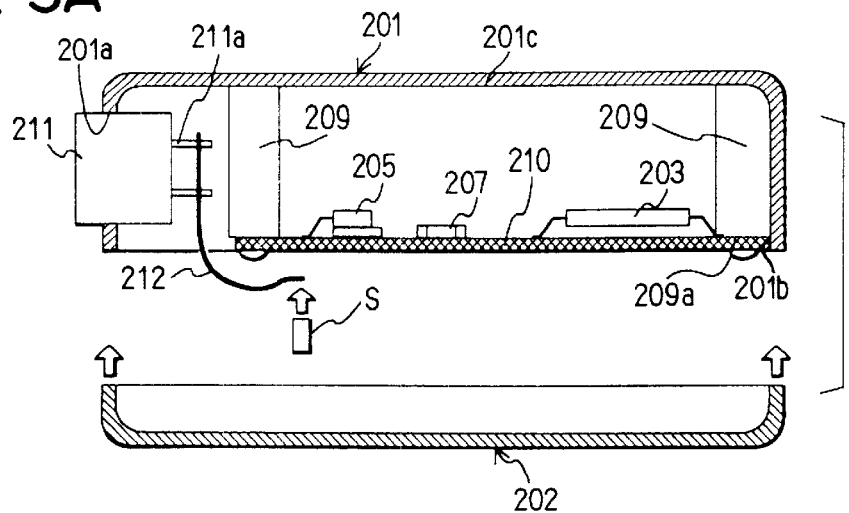
FIGS. 3A and 3B are cross-sectional views of the first embodiment, showing a method of assembling the same.
Figure 3B:
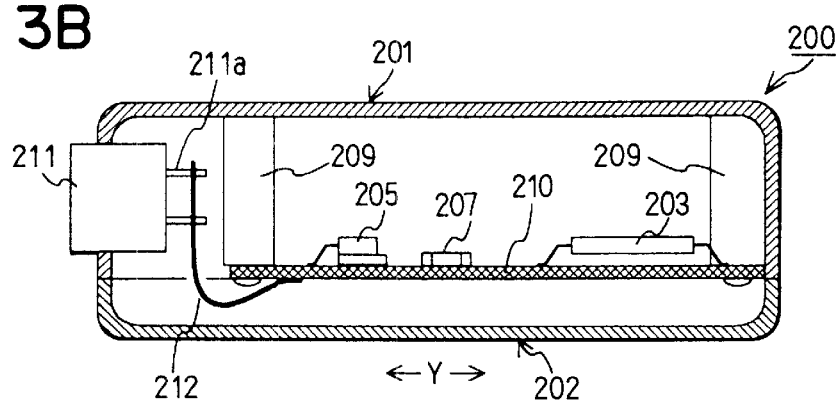

After the circuit board 210 and the connector 211 are mounted on the upper case 201, as shown in FIG. 3A, the flexible sheet 212 is soldered to the terminal portion of the circuit board 210 from the rear side of the circuit board 210. More particularly, solder paste is coated on the terminal portion of the circuit board 210, and the flexible sheet 212 is pressed down thereon with a heated jig S. Then, the bottom opening 201b of the upper case 201 is closed with the lower case 202 by mechanically connecting both cases 201 and 202. Thus, the electronic control unit 200 is completed.

Following advantages are obtained in the electronic control unit 200 as the first embodiment.

(1) After the circuit board 210 and the connector 211 are mounted on the upper case 201, both are electrically connected through the flexible printed-circuit sheet 211. Therefore, various connectors having different sizes and different number of pins can be selectively used without changing the layout of the circuit board 210. This is done by changing only the circuit pattern of the flexible sheet 212. Accordingly, the circuit board 210 can be standardized, thus reducing the manufacturing cost of the control unit 200. (2) The size of the circuit board 210 has not to be changed according to the size of the connector 211, because the connector pins 211a are not directly connected to the circuit board 210, but are indirectly connected via the flexible sheet 212. If the connector size is large but a small circuit board sufficiently covers required functions, then the small circuit board can be used. As exemplified in FIGS. 2A and 2B, the small circuit board can be made at a lower cost. (3) The space on the circuit board 210 can be to effectively utilized for mounting the components, because connector pins 211a are not directly connected to the circuit board 210. (4) Since the flexible printed-circuit sheet 212 is used, the electrical connections between the circuit board 210 and the connector 211 can be easily made, saving the number of parts at the same time. (5) Since the circuit board 210 is supported on the supporting surfaces 209a formed at corners of the casing, forming a space between the upper wall 201c and the circuit board 210, the space for mounting the components on the circuit board 210 is effectively utilized. (6) The circuit board 210 can be easily fixed to the stays 209 with screws. (7) Differently sized circuit boards 210 can be mounted in the same casing, because the supporting surfaces 209a are elongated and have plural screw holes 214. (8) Since the length (in Y direction) of the circuit board 210 is common to all the circuit boards having respective widths (in X direction), the length of the flexible sheet 212 connecting the connector 211 to the circuit board 210 can be maintained constant for the differently sized circuit boards.

Figure 4A:
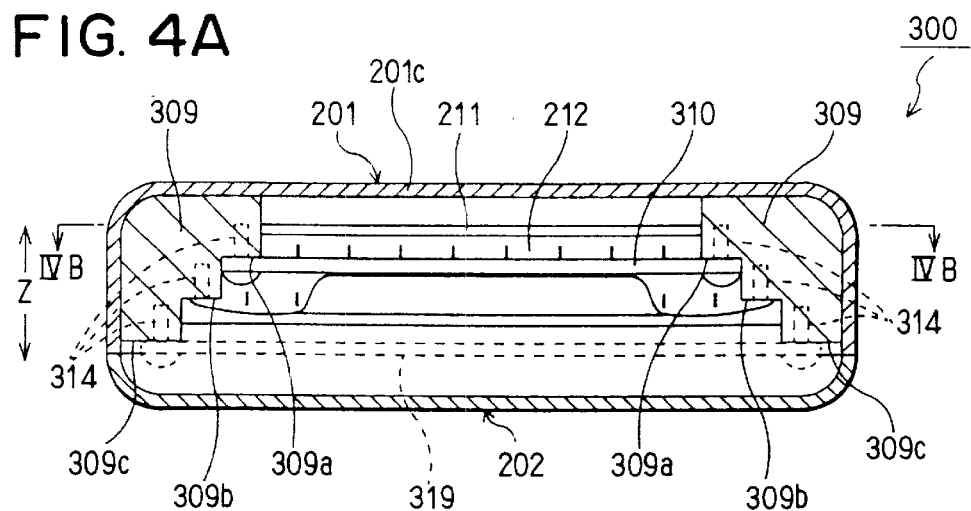
FIG. 4A is a cross-sectional view showing an electronic control unit as a second embodiment of the present invention, taken along line IVA—IVA of FIG. 4B.
Figure 4B:
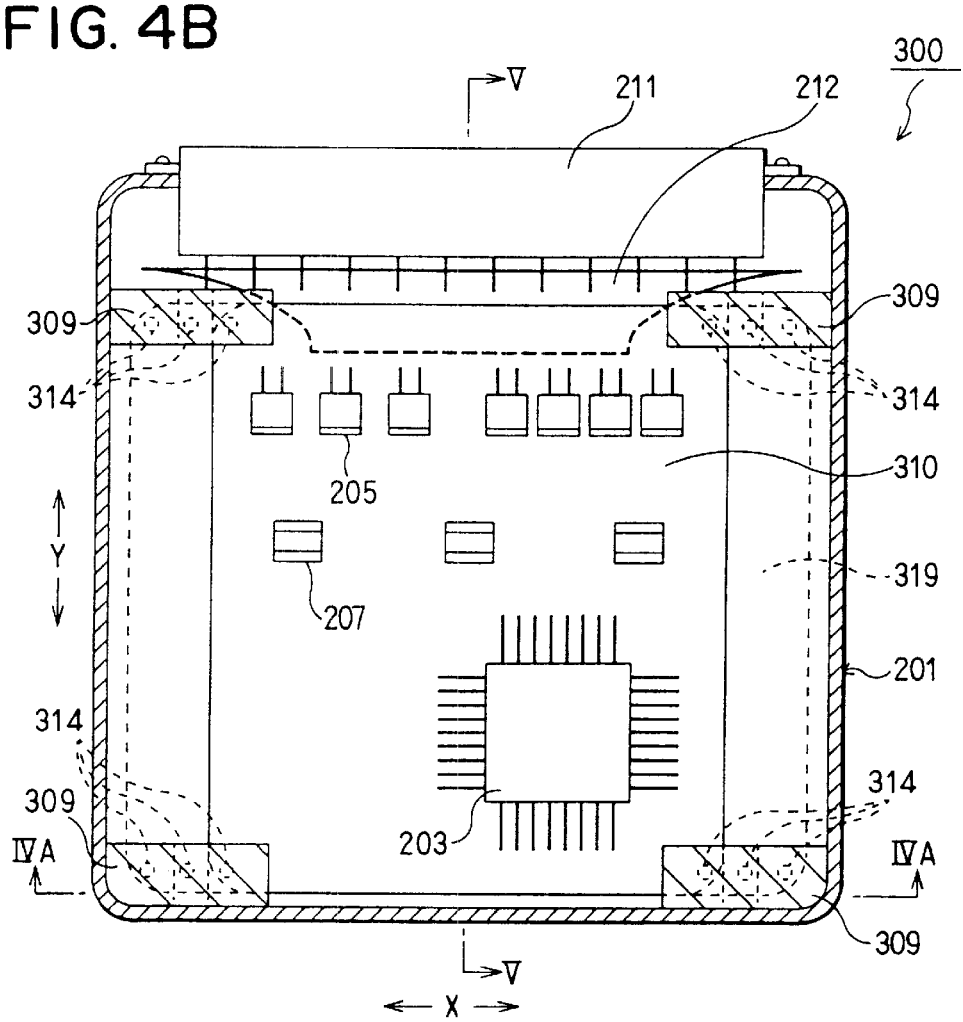
FIG. 4B is a cross-sectional view showing the second embodiment, taken along line IVB—IVB of FIG. 4A.

An electronic control unit 300 as a second embodiment of the present invention will be described with reference to FIGS. 4A, 4B and 5. FIGS. 4A and 4B correspond to FIGS. 1A and 1B showing the first embodiment, respectively. In this embodiment, the flat supporting surface 209a of the first embodiment is modified to stepped surfaces, i.e., a first supporting surface 309a, a second supporting surface 309b and a third supporting surface 309c. Other structures are similar to those of the first embodiment. Therefore, structures specific to this embodiment will be described below.

The circuit board 310 and the connector 211 fixed to the upper case 201 are electrically connected by the flexible printed-circuit sheet 212 in the same manner as in the first embodiment. On the stay 309, the first supporting surface 309a for mounting a narrowest circuit board 310 is formed at a position closest to the upper wall 201c. The third supporting surface 309c for mounting a widest circuit board 319 is formed at a position farthest from the upper wall 201c, and the second supporting surface 309b for mounting a middle sized circuit board (not shown) is formed between the first and the second supporting surfaces 309a, 309c. In other words, three steps are formed on the stay 309 in Z direction shown in FIG. 4A. One of those circuit boards is selectively mounted on the respective supporting surfaces. Screw holes 314 for fixing the circuit board are formed on all the supporting surfaces 309a, 309b and 309c.

Figure 5:
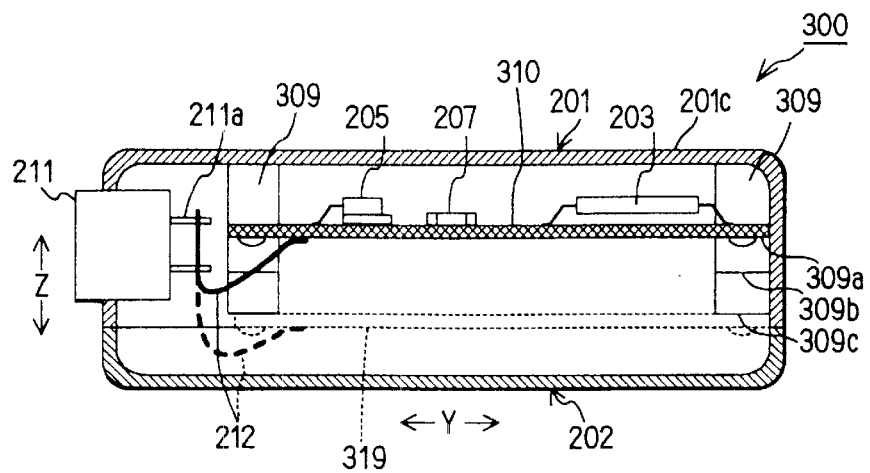
FIG. 5 is a cross-sectional view showing the second embodiment, taken along line V—V of FIG. 4B.

As shown in FIG. 5, which shows a cross-sectional view taken along line V—V shown in FIG. 4B, the narrowest circuit board 310 is mounted on the first supporting surface 309a and connected to the connector 211 through the flexible printed-circuit sheet 212. The circuit board 310 may be replaced with other sized circuit boards, for example, with the widest circuit board 319. The distance between the connector pins 211a and the terminal portion of the circuit board 310 or 319 is kept unchanged, not depending on the width of the selected circuit board.

In addition to the advantages of the first embodiment, the following advantages are attained in this second embodiment. Since the supporting surfaces are formed step-wise, lower supporting surfaces are not obstacles to the circuit board mounted on the upper supporting step. For example, when a small circuit board 310 is mounted on the first supporting surface 309a, the second and the third supporting surfaces 309a, 309b do not constitute obstacles to the circuit board 310. Accordingly, the surface area of the circuit board for mounting the components thereon is effectively utilized. Further, the circuit board is correctly positioned on the supporting surface because both sides of the circuit board fit within the vertical walls of the step, and the circuit board is easily fixed to the upper case with screws.

An electronic control unit 400 as a third embodiment of the present invention will be described with reference to FIGS. 6A and 6B, which correspond to FIGS. 1A and 1B showing the first embodiment, respectively. The third embodiment is similar to the first embodiment, except that supporting surfaces 415a formed at one side are made wider than the supporting surfaces 409a formed at the other side, and that a heat-dissipating wall 408 is additionally formed on the side wall of the upper case 201.

A first stay 409 having first supporting surfaces 409a and a second stay 415 having second supporting surfaces 415a are formed integrally with the upper case 201. The width of the second supporting surfaces 415a is made wider in X direction than that of the first supporting surfaces 409a. Two screw holes 416, an inner and an outer screw holes, are formed on the second supporting surface 415a, while one screw hole 414 is formed on the first supporting surface 409a. When a narrow circuit board 410 is used, it is fixed by screws screwed into the inner screw hole 416 formed on the second supporting surface 415a and the screw hole 414 formed on the first supporting surface 409a, as shown with a solid line in FIGS. 6A and 6B. When a wider circuit board 416 is used, it is fixed by screws screwed into the outer screw hole 416 and the screw hole 414, as shown with a dotted line.

In this manner, the wider circuit board 419 or the narrower circuit board 410 can be selectively mounted on the same casing. It is, of course, possible to design the casing to be able to mount one board selected from more than two circuit boards in the same manner. The length of the circuit boards (a size in Y direction) is always kept unchanged, while the width thereof (a size in X direction) is arbitrarily changed. Therefore, the length of the flexible printed-circuit sheet 212 connecting the connector 211 to the circuit board 410 or 419 is always kept unchanged. One side of the circuit board positioned on the first supporting surface 409a is kept unchanged, not depending on the width of the circuit board. On the other hand, the other side of the circuit board is differently positioned on the second supporting surface 415a, depending on the width of the circuit board.

Figure 6A:
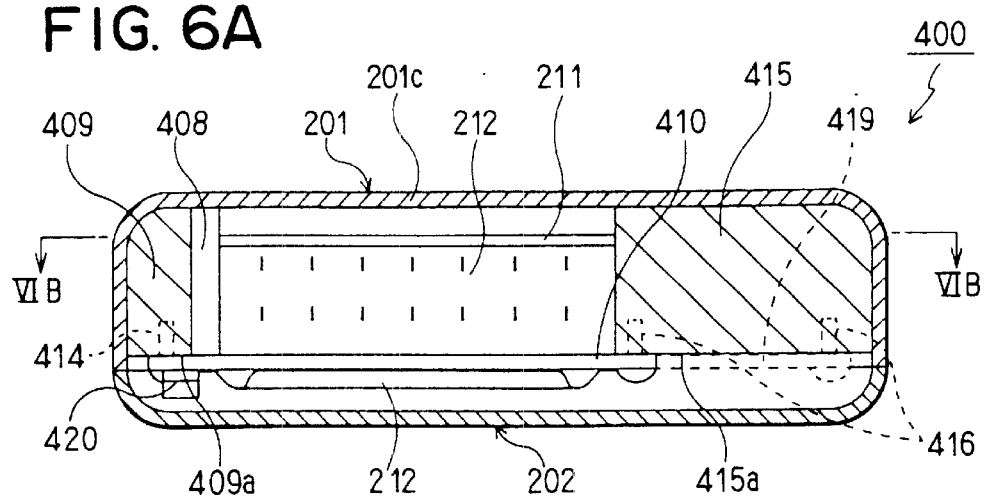
FIG. 6A is a cross-sectional view showing an electronic control unit as a third embodiment of the present invention, taken along line VIA—VIA of FIG. 6B.
Figure 6B:
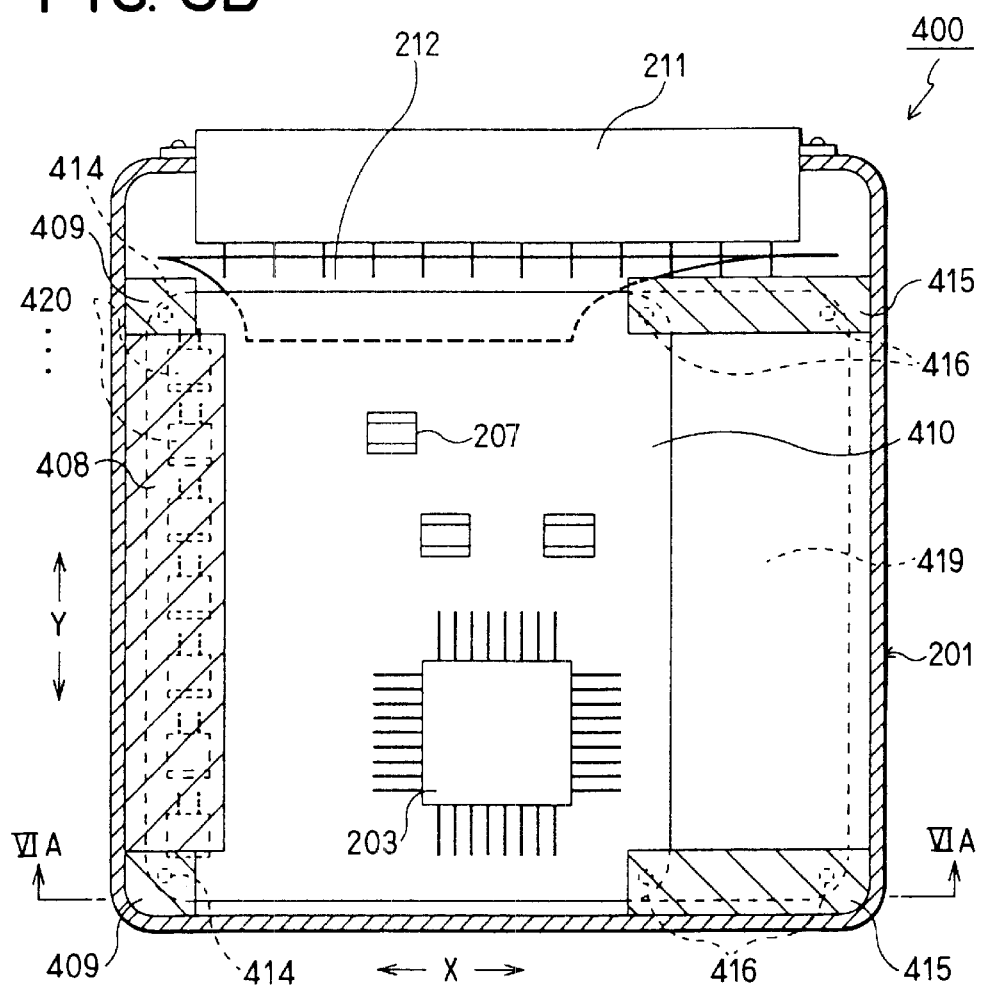
FIG. 6B is a cross-sectional view showing the third embodiment, taken along line VIB—VIB of FIG. 6A.

The heat-dissipating wall 408 is formed integrally with the upper case 201 along its sidewall, as shown in FIGS. 6A and 6B. Heat-generating components such as driving elements 420 are mounted on the rear side of the circuit board 410 at a position corresponding to the heat-dissipating wall 408. The circuit board 410 is adhered to the bottom surface of the heat-dissipating wall 408 with heat-conductive adhesive, or with heat-conductive grease interposed, so that the heat generated in the driving elements 420 is easily dissipated through the heat-dissipating wall 408.

In addition to the advantages attained in the first embodiment, the following advantage is attained in the third embodiment. That is, the heat generated in the heat-generating components mounted on the circuit board is quickly dissipated through the heat-dissipating wall 408, thereby suppressing a temperature rise in the electronic control unit 400.

Figure 7A:
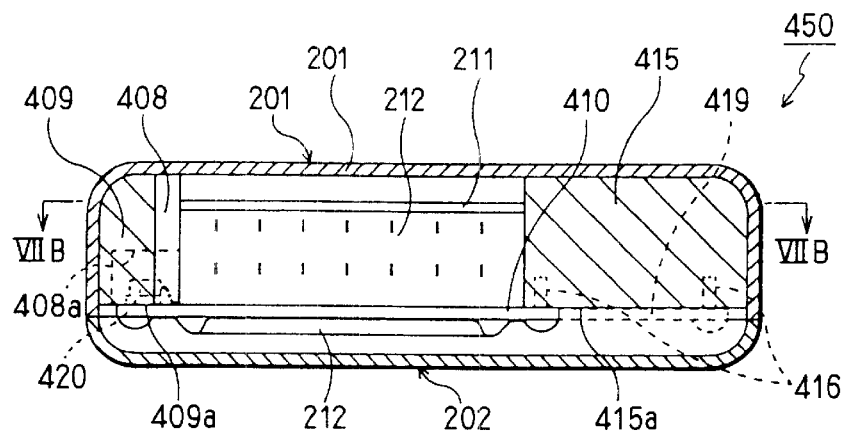
FIG. 7A is a cross-sectional view showing a modified form of the third embodiment, taken along line VIIA—VIIA of FIG. 7B.
Figure 7B:
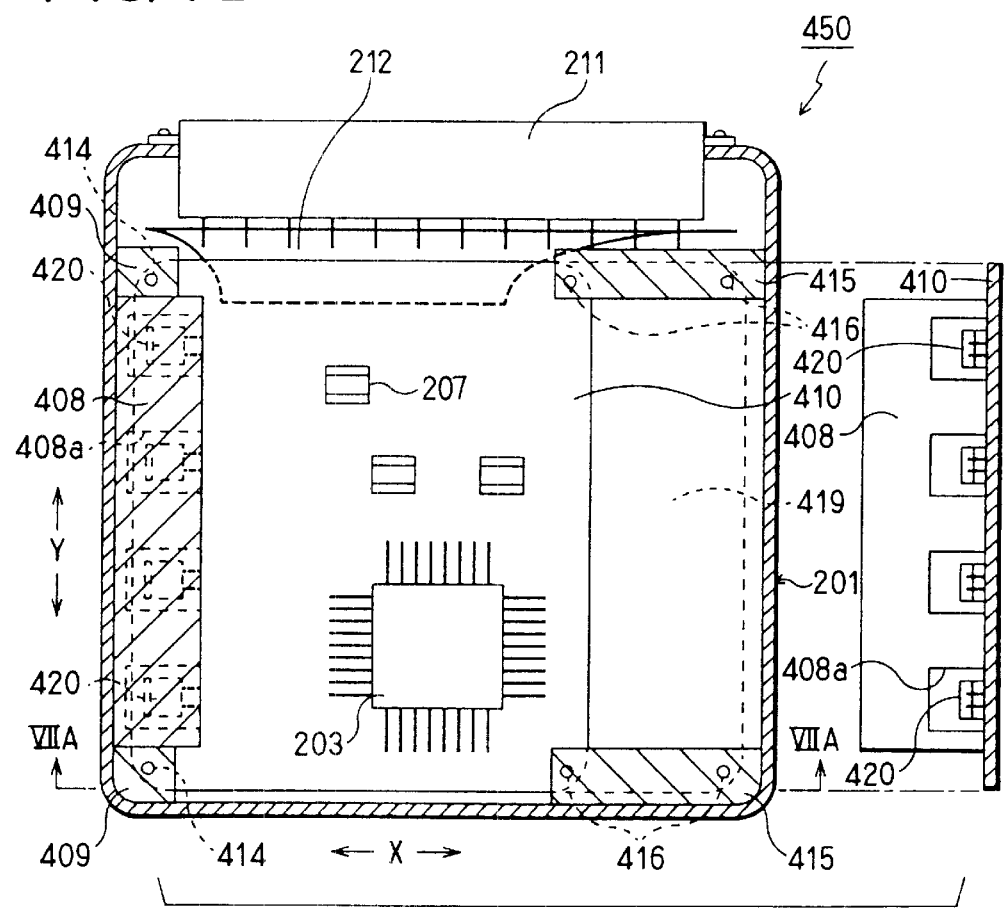
FIG. 7B is a cross-sectional view showing the modified form of the third embodiment, taken along line VIIB—VIIB of FIG. 7A.

A modified form of the third embodiment 450 will be described with reference to FIGS. 7A and 7B, which correspond to FIGS. 6A and 6B showing the third embodiment, respectively. In this modified form, cavities 408a for accommodating the heat-generating components such as the driving elements 420 therein are formed in the heat-dissipating wall 408. The driving elements 420 are mounted on the front surface of the circuit board 410 at positions corresponding to the cavities 408a. The driving elements 420 are positioned in the cavities 408a, and the circuit board 410 is adhered to the heat-dissipating wall 408, so that heat is efficiently transferred from the circuit board 410 to the heat-dissipating wall 408. The temperature rise in the electronic control unit 450 is further reduced due to the cavities 408a accommodating the heat-generating components therein.

The foregoing embodiments may be variously modified. For example, to selectively mount variously sized circuit boards in the same casing, the length (in Y direction) of the circuit board may be changed instead of changing the width (in X direction). In this case, the supporting surfaces for mounting the variously sized circuit boards are formed along the sidewall parallel to Y direction. The circuit board is not necessarily fixed to the casing with screws. It may be adhered to the casing with adhesive, or only one side of the circuit board may be fixed by screws and the other side may be connected with adhesive. Though the stays for supporting the circuit board are separately formed at four corners of the upper case in the foregoing embodiments, it is also possible to form a single frame along sidewalls of the upper casing. Though the heat dissipating wall 408 is formed along the Y direction sidewall of the upper case 201 in the third embodiment, it may be formed along the X direction sidewall, because one side of the circuit board having various widths, is always positioned along the X direction sidewall. Though the stays and the heat-dissipating wall are made integrally with the upper case in the foregoing embodiments, they may be separately made and attached to the upper case.

Figure 8A:
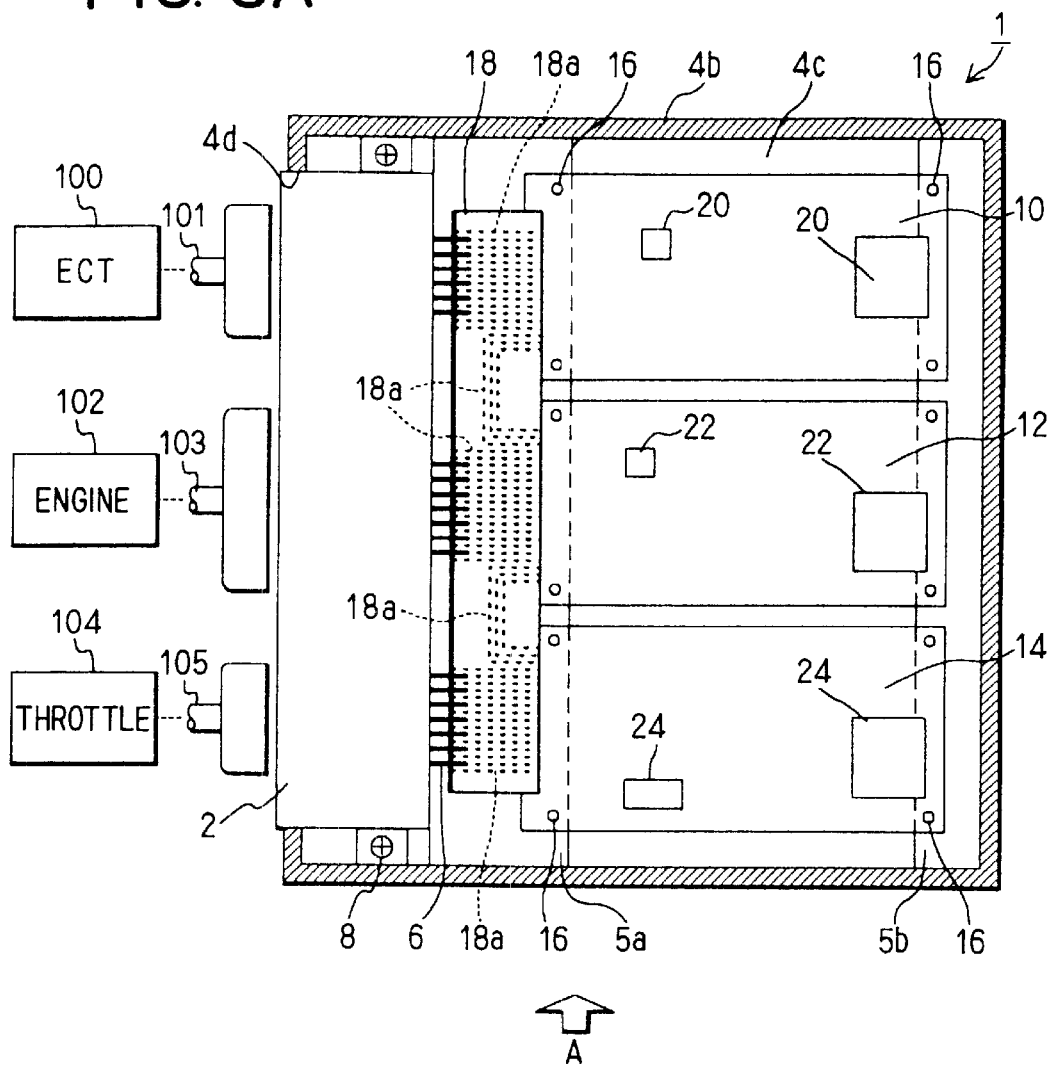
FIG. 8A is a cross-sectional view showing an electronic control unit as a fourth embodiment of the present invention, viewed from its top.
Figure 8B:
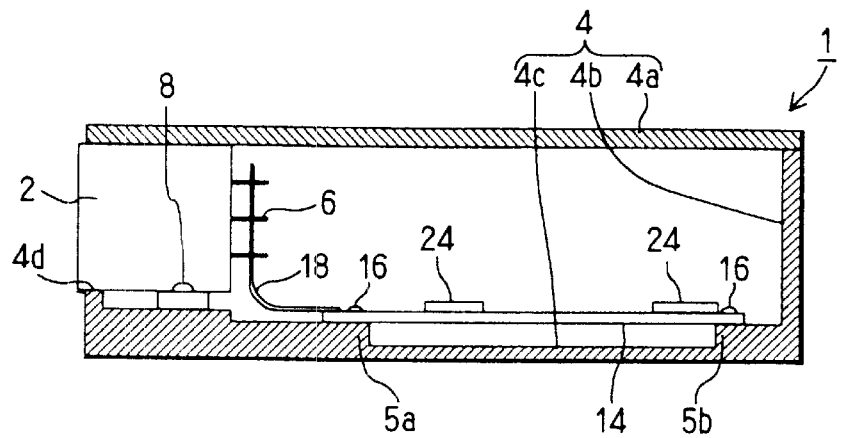
FIG. 8B is a cross-sectional view showing the fourth embodiment, viewed from direction A shown in FIG. 8A.

A fourth embodiment of the present invention will be described with reference to FIGS. 8A–9F. First, referring to FIGS. 8A and 8B, the structure of an electronic control unit 1 for use in an automobile will be described. FIG. 8A shows an inside structure of the control unit 1, viewed from its top with an upper cover removed. FIG. 8B briefly shows a vertical structure of the control unit 1, viewed in direction A shown in FIG. 8A. The control unit 1 is connected to an electronically controlled transmission (ECT) 100 through a cable 101, an engine 102 through a cable 103 and an electronically controlled throttle valve 104 through a cable 105. The control unit 1 is composed of a casing 4; three circuit boards, i.e., an ECT-control circuit board 10, an engine-control circuit board 12 and a throttle-control circuit board 14; a connector 2; and a flexible printed-circuit sheet 18 for connecting the connector 2 to the circuit boards. In other words, a single circuit board used in the foregoing embodiments 1–3 is divided into three circuit boards, each corresponding to each object to be controlled.

The casing 4 includes a lower case composed of a bottom plate 4c and a sidewall 4b and a cover plate 4a. A side opening 4d is formed in the sidewall 4b for receiving a connector 2 therethrough. The connector 2 is mounted on the bottom plate 4c by screws 8 and electrically connected to the respective cables 101, 103 and 105. The connector 2 has plural connector pins 6 aligned along the longitudinal direction of the connector 2. Supporting portions 5a and 5b are provided on the bottom plate 4c of the casing 4, and the circuit boards 10, 12 and 14 are mounted thereon and fixed by screws 16 or adhesive.

The ECT-control circuit board 10 constitutes a circuit for controlling operation of the ECT together with components 20 mounted thereon. The engine-control circuit board 12 constitutes a circuit for controlling operation of the engine together with components 22 mounted thereon. Similarly, the throttle-control circuit board 14 constitutes a circuit for controlling operation of the throttle valve together with components 24 mounted thereon. As shown in FIG. 8A, three circuit boards 10, 12, 14, are aligned in the casing 4 in this order, so that each circuit board corresponds to each cable 102, 103, 103, respectively.

A terminal portion of each circuit board 10, 12, 14 is connected to connector pins 6 by flexible wires. Preferably, the flexible wires are all included in a single flexible printed-circuit sheet 18 having a circuit pattern 18a. As shown in FIG. 8B, one end of the flexible sheet 18 is electrically connected to the connector pins 6. The connector pins 6 are inserted into holes formed on the flexible sheet 18 and soldered thereto. The other end of the flexible sheet 18 is electrically connected to the terminal portion of each circuit board 10, 12, 14 and supported on the supporting portion 5a. The circuit pattern 18a of the flexible sheet 18 not only connects the connector pins 6 to circuit boards 10, 12, 14 but also makes connections among the circuit boards.

A method of manufacturing the electronic control unit 1 will be described with reference to FIGS. 9A–9F. First, the circuit boards standardized for each object to be controlled are prepared. For example, as shown in FIG. 9A, three types of the engine-control circuit board 12 are prepared, i.e., the first type ENG-1 for controlling a four-cylinder engine, the second type ENG-2 for a six-cylinder engine and the third type ENG-3 for an eight-cylinder engine. The shape and size of those circuit boards ENG-1, ENG-2, ENG-3 are all standardized so that one of those can be selectively mounted on the same cashing 4. Similarly, three types of the ECT-control circuit board 10 are prepared, i.e., the first type ECT-1 for controlling a four-speed transmission, the second type ECT-2 for a six-speed transmission and the third type ECT-3 for controlling a continuously variable transmission (CVT). The shape and size of those circuit boards ECT-1, ECT-2, ECT-3 are all standardized so that one of those can be selectively mounted on the same casing 4. One type of the throttle-control circuit board 14 (not shown) is prepared in this particular example. However, some types of the throttle-control circuit boards may be prepared if necessary.

The material and the structure of respective circuit boards are properly selected to meet respective objects to be controlled and types of objects. For example, if required control functions are sophisticated, a multi-layer circuit board is prepared. If a large amount of heat is generated in a circuit board, the circuit board is made of a material having high heat conductivity, such as a heat conductive ceramic material or a metal-cored board.

Then, one of the circuit board is selected from among prepared circuit boards for each object to be controlled. For example, as shown in FIG. 9B, ECT-2 for controlling the 6-speed transmission is selected as the ECT-control circuit board 10, ENG-1 for the four-cylinder engine as the engine-control circuit board 12, and THROTTLE as the throttle control circuit board 14. The selected circuit boards are mounted on the cashing 4, so that they are respectively supported on the supporting portions 5a and 5b.

On the other hand, several types of the connector 2 and flexible printed-circuit sheet 18 are also prepared as shown in FIG. 9C. A connector 2 and a flexible sheet 18 which correspond to the control unit 1 to be manufactured are selected, and both are electrically connected to each other by soldering as shown in FIG. 9D. Then, the connector 2 to which the flexible sheet 18 is connected is mounted on the bottom plate 4c of the cashing 4 as shown in FIG. 9E.

Then, as shown in FIG. 9F, a free end of the flexible sheet 18 is electrically connected to the terminal portions of the circuit boards 10, 12, 14. More particularly, solder is attached to the terminal portions, and the end of the flexible sheet 18 is pressed down thereon with a heated jig S. The flexible sheet 18 is soldered to the circuit boards at the position where the circuit boards are supported by the supporting portion 5a.

Following advantages are attained in the above-described fourth embodiment. Since each circuit board 10, 12, 14 corresponding to each object to be controlled is selectively mounted on the same casing 4, an electronic control unit 1 is easily manufactured at a low cost. For example, if only the types of the engine are changed, without changing the types of the transmission and the throttle valve, the control unit 1 is manufactured by only replacing the engine-control circuit board 12 with a new one. This means that many variations of the control unit 1 can be easily manufactured to meet various requirements in automobile use. Since variations of the circuit boards 10, 12, 14, the flexible sheets 18 and the connectors 2 are all pre-fabricated and each one of those variations are selectively used, various types of the control unit 1 are economically and quickly assembled according to requirements.

Since a suitable board material is used for respective circuit boards 10, 12, 14, the circuit boards are properly designed and economically manufactured. Since the connector 2 and the circuit boards 10, 12, 14 are connected through the flexible printed-circuit sheet 18, the control unit 1 can be structured only by changing the types of the flexible sheet 18 without changing an entire layout of the circuit boards 10, 12, 14, when the types of the connector 2 are changed. Further, the flexible sheet 18 reduces the number of parts to be used for making electrical connections. Since the terminal portions of the circuit boards 10, 12, 14 are all positioned to face the flexible sheet 18, the flexible sheet 18 is easily soldered to all the circuit boards 10, 12, 14.

Since the circuit pattern 18a formed on the flexible sheet 18 not only connects the connector 2 to the circuit boards 10, 12, 14 but also makes connections among the circuit boards, all the electrical connections are efficiently made without fail. Since the connector 2 and the flexible sheet 18 are electrically connected before the connector 2 is mounted on the casing 4, such connection can be easily carried out. Since the flexible sheet 18 is soldered to the circuit boards 10, 12, 14 at positions where the circuit boards are supported by the supporting portion 5a, such soldering is performed without damaging or deforming the flexible sheet 18.

An electronic control unit 500 as a fifth embodiment of the present invention will be described with reference to FIGS. 10A and 10B. The control unit 500 includes three functionally separated circuit boards, i.e., an input circuit board 510, an output circuit board 512 and a control circuit board 514. The input circuit board 510 on which components 520 are mounted handles various inputs fed to the control unit 500. The output circuit board 512 on which components 522 such as power transistors are mounted handles outputs to be supplied to outside devices. The control circuit board 514 on which components 524 such as a central processing unit are mounted performs such functions as calculation, control and memory.

Figure 10A:
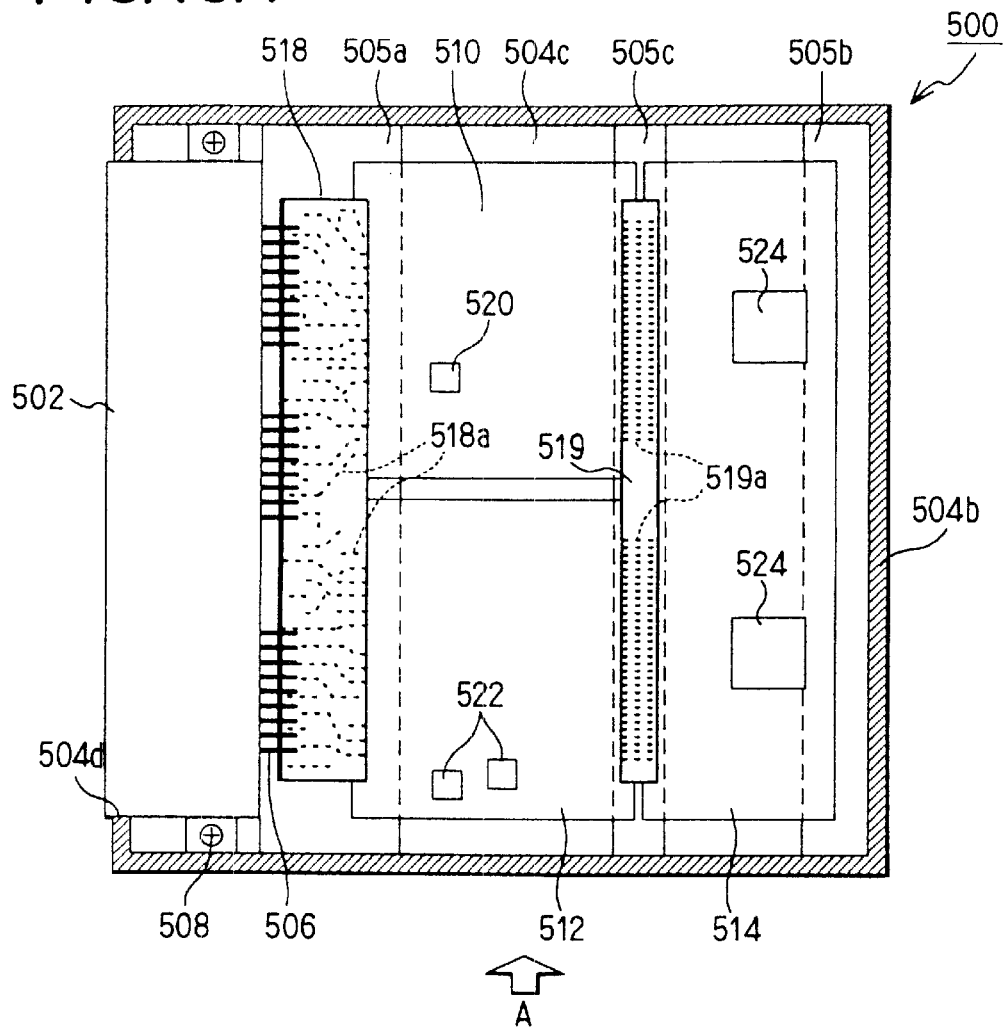
FIG. 10A is a cross-sectional view showing an electronic control unit as a fifth embodiment of the present invention.

FIG. 10A shows an inside structure of the control unit 500, viewed from its top with an upper plate removed. FIG. 10B briefly shows a vertical structure of the control unit 500, viewed in direction A shown in FIG. 10A. The control unit 500 controls the same automotive actuators as those controlled by the fourth embodiment. The control unit 500 is composed of a casing 504; three control circuit boards, i.e., the input circuit board 510, the output circuit board 512 and the control circuit board 514; a connector 502; a flexible printed-circuit sheet 518 for connecting the connector 502 to the circuit boards 510, 512; and another flexible printed-circuit sheet 519 for connecting the circuit boards 510, 512 to the circuit board 514. The casing 504 includes a lower case composed of a bottom plate 504c and a sidewall 504b and a cover plate 504a. A side opening 504d is formed in the sidewall 504b for receiving a connector 502 therethrough. The connector 502 is mounted on the bottom plate 504c by screws 508. The connector 502 has plural connector pins 506 aligned along the longitudinal direction of the connector 502. Supporting portions 505a, 505b and 505c are provided on the bottom plate 504c of the casing 504, and the circuit boards 510, 512 and 514 are mounted thereon.

As shown in FIG. 10A, two circuit boards 510, 512 are aligned in the casing 504 along the longitudinal direction of the connector 502. The control circuit board 514 is positioned at the right side of the circuit boards 510, 512. Terminal portions of the circuit boards 510, 512 are connected to connector pins 506 by the flexible printed-circuit sheet 518 having a circuit pattern 518a. The other flexible sheet 519 having a circuit pattern 519a electrically connects the circuit boards 510, 512 to the control circuit board 514, respectively. As shown in FIG. 10B, one end of the flexible sheet 518 is electrically connected to the connector pins 506. The connector pins 506 are inserted into holes formed on the flexible sheet 518 and soldered thereto. The other end of the flexible sheet 518 is electrically connected to the terminal portions of circuit boards 510, 512 and is supported on the supporting portion 505a. The right sides of the circuit boards 510, 512 and the left side of the circuit board 514 are commonly supported on the supporting portion 505c, and the flexible sheet 519 are soldered to those circuit boards at the position corresponding to the supporting portion 505c.

A manufacturing process of the fifth embodiment, which is similar to that of the fourth embodiment, will be briefly described below. Three circuit boards 510, 512, 514 are separately prepared. Some variations of each circuit board, which are selectively mountable on the same casing 504, are also prepared. The input circuit board 510 is made of a four-layer BVH board (a board having printed four conductor layers connected through Blind Via Holes). The control circuit board 514 is made of a six-layer BVH board, because it performs sophisticated functions. The output circuit board 512 is made of a heat conductive board such as a metal-cored printed board or a ceramic plate, because a high amount heat is generated in the output circuit board 512. The output circuit board 512 may be mounted in contact with a heat-dissipating wall formed in the casing 504 to quickly dissipate heat generated in the output circuit board 512. Similarly, several variations of the connector 502 and flexible sheets 518, 519 are prepared.

Circuit boards 510, 512, 514, the connector 502 and the flexible sheets 518, 519 for constituting the control unit 500 are selected form among pre-fabricated respective variations. Then, the selected circuit boards 510, 512, 514 are mounted on the bottom plate 504c to be supported by the respective supporting portions 505a, 505b, 505c. The flexible sheet 518 is electrically connected to the connector 502 by soldering. Then, the connector 502 to which the flexible sheet 518 is soldered is inserted through the side opening 504d and mounted on the bottom plate 504c by screws 508.

Then, the flexible sheet 518 is electrically connected to both circuit boards 510, 512 at the position corresponding to the supporting portion 505a. Then, one side of the flexible sheet 519 is electrically connected to circuit boards 510, 512 by soldering, and the other side to the circuit board 514. Such electrical connection is made at the position corresponding to the supporting portion 505c that commonly supports the circuit boards 510, 512, 514.

The similar advantages as in the fourth embodiment are attained in this fifth embodiment, too. Especially, in this embodiment, the control unit 500 can be easily modified by replacing only a circuit board corresponding to a modified function (input, output or control) with a new one without changing its entire structure, because the circuit is structured function by function. Further, since the output circuit board 512 that generates heat is separated from other circuit boards 510, 514, heat transfer from the output circuit board 512 to other circuit boards 510, 514 is suppressed. Therefore, control elements such as the central processing units 524 mounted on the control circuit board 514 are protected from an excessive temperature rise.

A modified form of the fifth embodiment will be briefly described with reference to FIGS. 11A and 11B which correspond to FIGS. 10A and 10B, respectively. In this modified form, the casing 504 of the fifth embodiment is replaced with a casing 507 consisting of an upper case 507a and a bottom plate 507b. The upper case 507a includes a sidewall formed integrally therewith. The functionally divided circuit boards 510, 512, 514 are fixed to the supporting portions 505a, 505b, 505c of the bottom plate 507b by screws 509. Other structures are the same as those of the fifth embodiment.

The electronic control unit 500 is manufactured in the similar manner as the fifth embodiment. After all the circuit boards 510, 512, 514 and the connector 502 are mounted on the bottom plate 507b, the flexible printed-circuit sheets 518, 519 are pressed down by heated jigs S to the circuit boards at the positions under which the supporting portions 505a, 505c are located. Thus, the flexible sheets 518, 519 are soldered to the circuit boards 510, 512, 524. Finally, the upper case 507a is mechanically connected to the bottom plate 507b to form the casing 507.

Figure 10B:
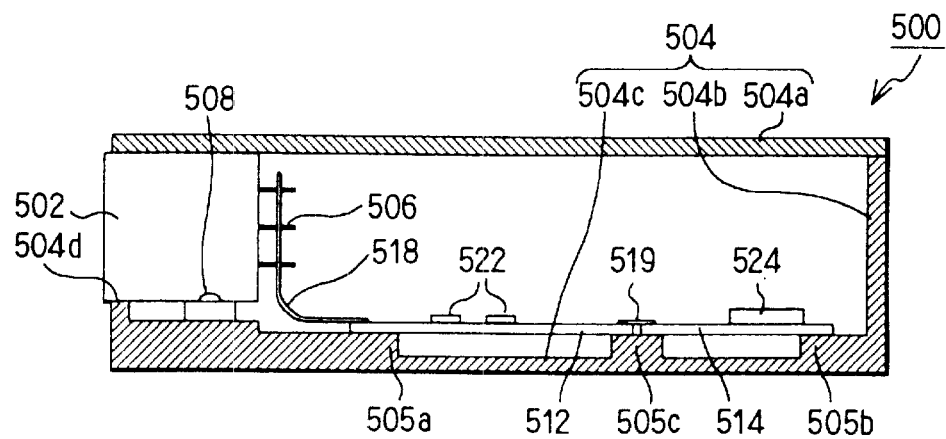
FIG. 10B is a cross-sectional view showing the fifth embodiment, viewed from direction A shown in FIG. 10A.
Figure 11A:
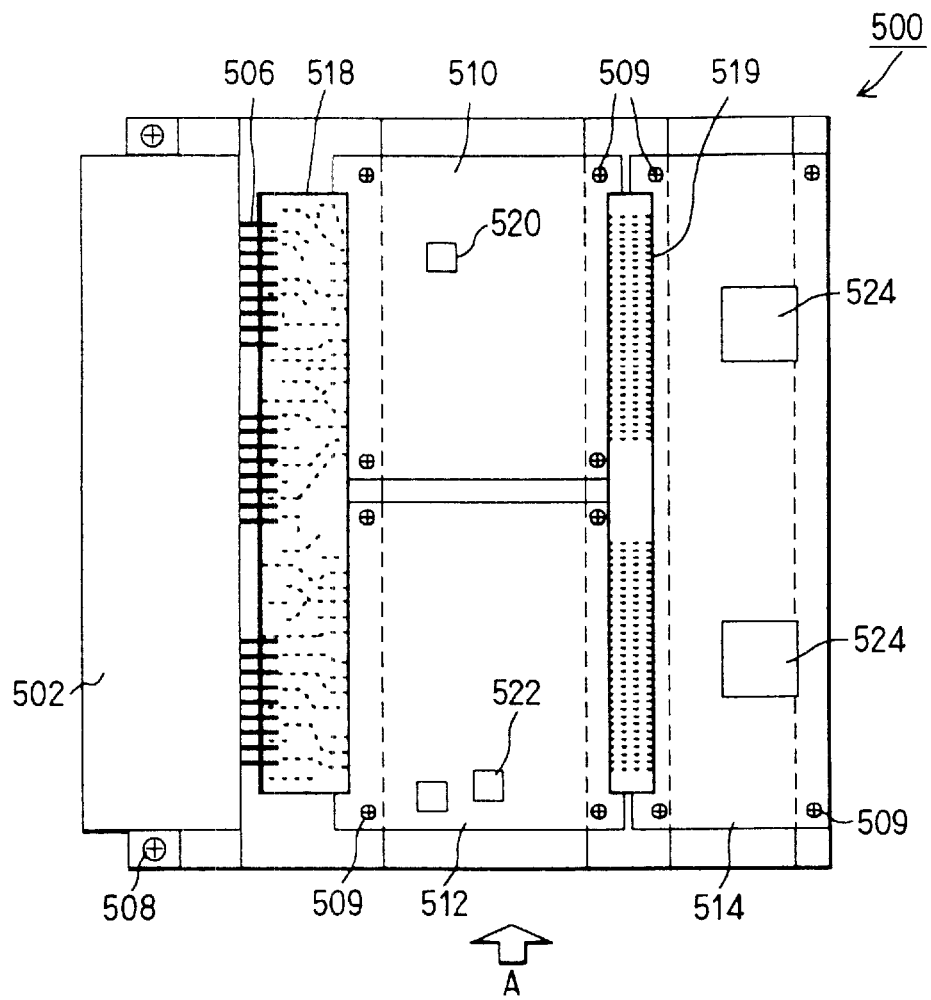
FIG. 11A is a plan view showing a modified form of the fifth embodiment with its upper case removed.
Figure 11B:
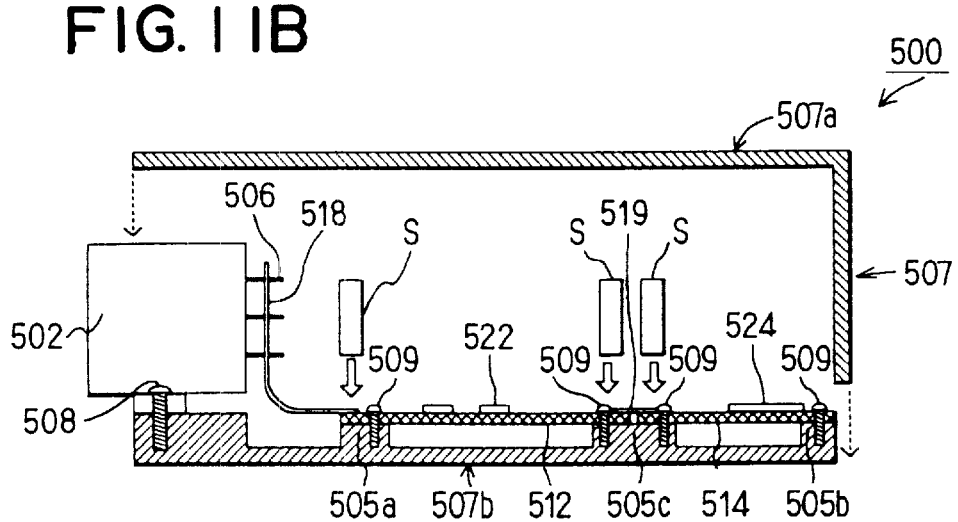
FIG. 11B is a cross-sectional view showing a process of assembling the modified form of the fifth embodiment.
Figure 12A:
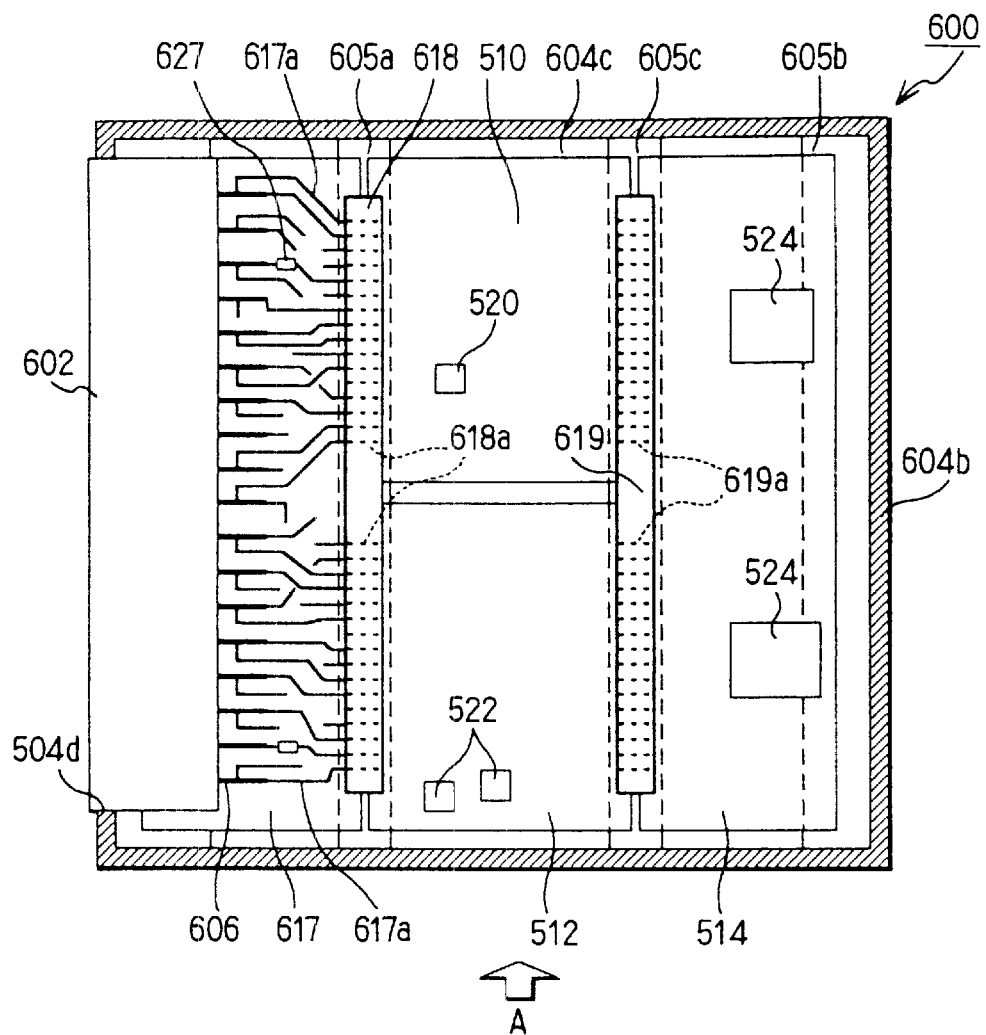
FIG. 12A is a cross-sectional view showing a sixth embodiment of the present invention.
Figure 12B:
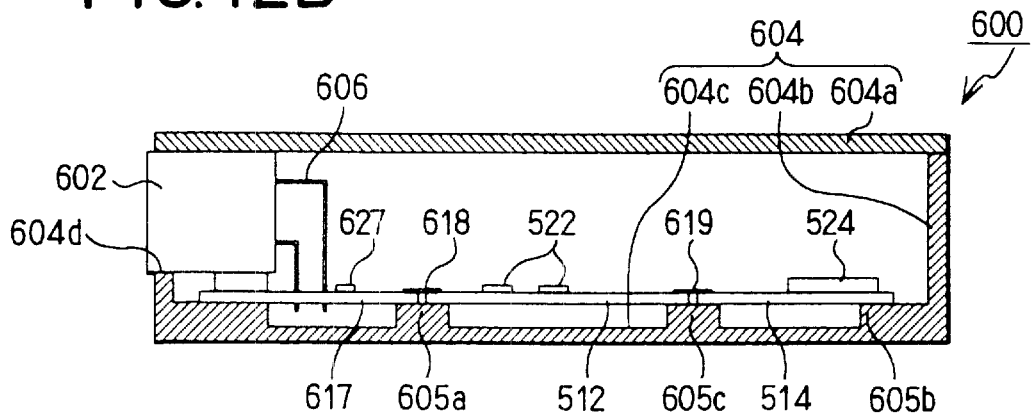
FIG. 12B is a cross-sectional view showing the sixth embodiment, viewed from direction A shown in FIG. 12A.

A sixth embodiment 600 of the present invention will be described with reference to FIGS. 12A and 12B which correspond to FIGS. 10A and 10B showing the fifth embodiment, respectively. This embodiment is similar to the fifth embodiment, except that a connector 602 is electrically connected to both circuit boards 510, 512 via a signal alignment board 617, and that noise-absorbing elements 627 are mounted on the signal alignment board 617.

Three functionally divided circuit boards, i.e., the input circuit board 510, the output circuit board 512 and the control circuit board 514, and the connector 602 are contained in a casing 604 in the similar manner as in the fifth embodiment. The signal alignment board 617 on which a circuit pattern 617a for aligning input signals is printed is also contained in the casing 604. The connector 602 is electrically connected to the circuit boards 510, 512 through the signal alignment board 617 and a flexible printed-circuit sheet 618 having a circuit pattern 618a. The control circuit board 514 and the circuit boards 510, 512 are electrically connected through another flexible printed-circuit sheet 619 having a circuit pattern 619a.

The casing 604 is composed of an upper plate 604a, a sidewall 604b and a bottom plate 604c. The bottom plate 604c includes supporting portions 605a, 605b, 605c for supporting the circuit boards 510, 512, 514 and the signal alignment board 617 thereon. A side opening 604d for inserting the connector 602 therethrough is formed in the sidewall 604b. The connector 602 has plural angled connector pins 606. The connector pins 606 are inserted into holes formed in the signal alignment board 617 and soldered thereto. The noise-absorbing elements 627 for absorbing noises coming into the electronic control unit 600 are mounted on the signal alignment board 617.

The reason why the signal alignment board 617 is additionally used in this embodiment is as follows. If no signal alignment board 617 is used, circuits in the circuit pattern 618a formed on the flexible sheet 618 cross-over one another to connect the connector 602 to both circuit boards 510 and 512. The circuit pattern 617a printed on the signal alignment board 617 is formed to avoid the circuit cross-over in the flexible sheet 618. By adding the signal alignment board 617, the circuits in the circuit pattern 618a can be made all in parallel as shown in FIG. 12A.

The electronic control unit 600 is manufactured in the similar manner as the fifth embodiment. Some variations of each circuit board 510, 512, 514 are prepared. Similarly, some variations of the connector 602, flexible sheets 618, 619 and the signal alignment board 617 are pre-fabricated. Those components to be used in a particular control unit 600 are selected from among the prefabricated ones. Then, three circuit boards 510, 512, 514 are mounted on the bottom plate 604c. The connector 602 to which the signal alignment board 617 and the flexible sheet 618 are connected is also mounted on the bottom plate 604c, as shown in FIG. 12B. Then, both flexible sheets 618 and 619 are soldered to complete electrical connections between the signal alignment board 617 and circuit boards 510, 512, 514, as shown in FIGS. 12A and 12B.

The similar advantages of the fifth embodiment are attained in the sixth embodiment, too. In addition, the flexible printed-circuit sheet 618 used in this embodiment can be simplified because the circuits therein are all in parallel. Accordingly, there is no need to use a multi-layer flexible sheet to built cross-over circuits therein. Since the signal alignment board 617 is interposed between the connector 602 and the flexible sheet 618, various types of the connector 602 can be easily used only by changing the circuit patterns 617a and 618a. Further, since noise-absorbing elements 627 are mounted on the signal alignment board 617, there is no need to mount such noise-absorbing elements on the respective circuit boards.

The signal alignment board 617 used in the sixth embodiment may be used also in the fourth and fifth embodiments. Though the flexible sheet 618 is soldered to the signal alignment board 617 before the signal alignment board 617 is mounted on the bottom plate 604c, the flexible sheet 618 may be soldered to both the signal alignment board 617 and the circuit boards 510, 512 after the. signal alignment board 617 is mounted. The flexible printed-circuit sheet commonly used for connecting plural circuit boards in the fourth, fifth and sixth embodiments may be divided into plural sheets, each corresponding to each circuit board.

Figure 13:
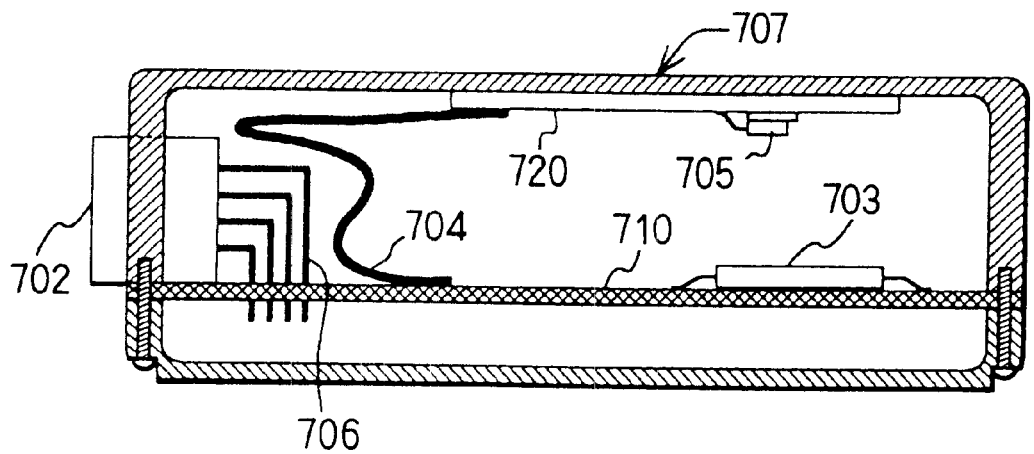
FIG. 13 is a cross-sectional view showing an electronic control unit as a comparative example of a seventh embodiment of the present invention.

A seventh embodiment of the present invention will be described with reference to FIGS. 13 and 14. FIG. 13 shows a comparative example of the seventh embodiment. In this example, a driving circuit board 720 on which heat-generating components 705 such as power transistors are mounted is fixed to an upper wall of a metallic casing 707. A control circuit board 710 on which control elements 703 such as a microcomputer are mounted is supported in the middle portion of the casing 707. A connector 702 having plural connector pins 706 is mounted on the control circuit board 710, and the connector pins 706 are electrically connected to the control circuit board 710. The driving circuit board 720 and the control circuit board 710 are electrically connected through a flexible printed-circuit sheet 704.

This structure is advantageous in dissipating heat generated in the driving circuit board 720 and in reducing heat transfer from the driving circuit board 720 to the control circuit board 710. However, the control circuit board 710 is supported in the casing 707 only at both sides thereof. Therefore, when the flexible sheet 704 is pressed-down on and soldered to the control circuit board 710, the control circuit board 710 tends to deform. It is desirable to provide an additional support to the control circuit board 710.

Figure 14:
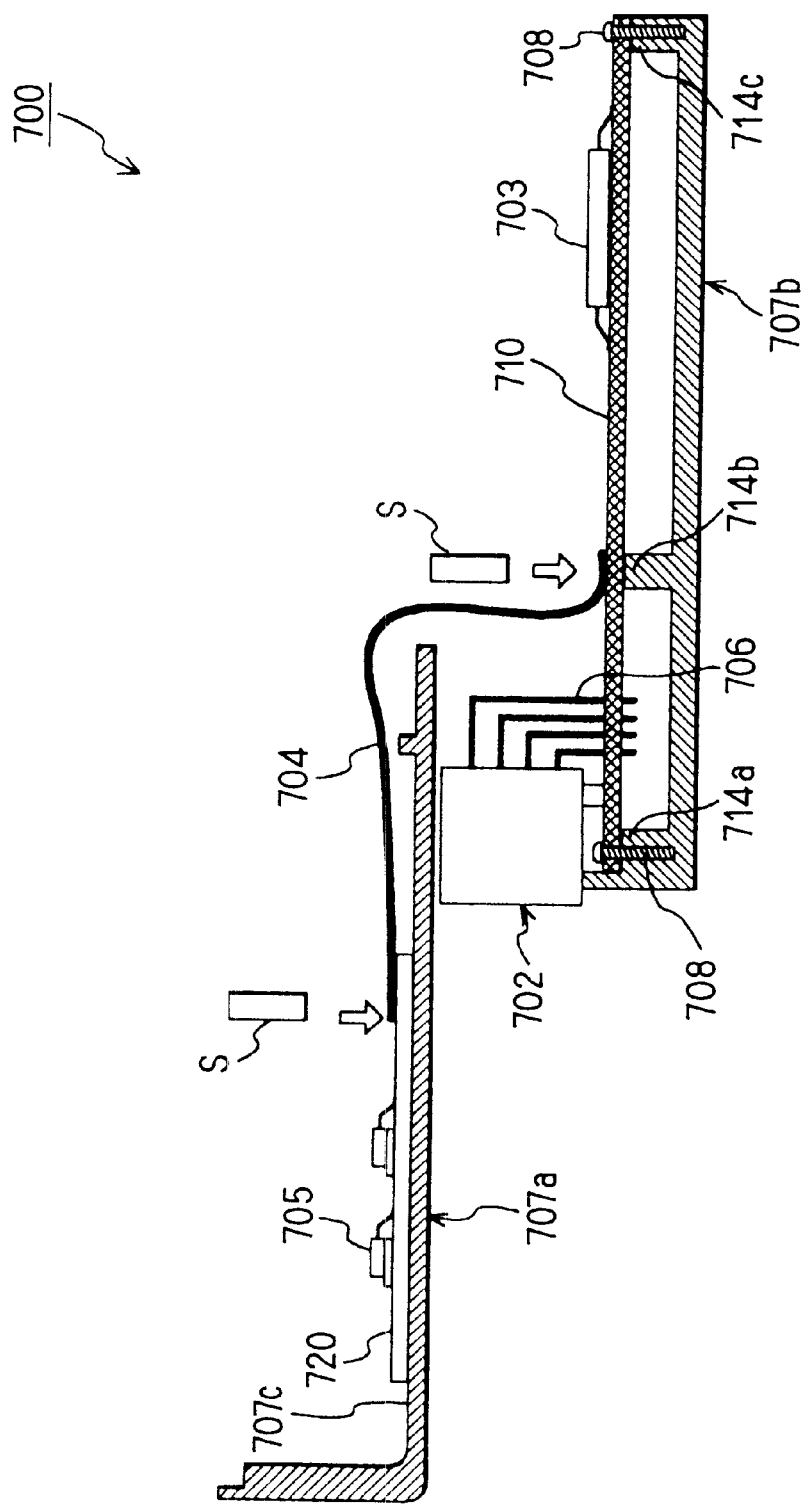
FIG. 14 is a cross-sectional view showing a process of assembling the seventh embodiment.

FIG. 14 shows the seventh embodiment of the present invention, focusing on a process of assembling the same. The control circuit board 710 is additionally supported by a supporting portion 714b formed on a lower case 707b at a position where the flexible sheet 704 is soldered on the control circuit board 710.

An electronic control unit 700 as the seventh embodiment is assembled in the following manner. First, the driving circuit board 720 carrying the driving elements 705 thereon is fixed to an inner surface 707c of the upper case 707a in good heat-conductive relation. On the other hand, the control circuit board 710 on which the connector 702 and control elements 703 are mounted is fixed to a lower case 707b by screws 708. Plural connector pins 706 of the connector 702 are inserted into the control circuit board 710 and soldered thereto. The control circuit board 710 is supported by supporting portions 714a, 714c at both sides thereof and by the supporting portion 714b at the position where the flexible sheet 704 is to be soldered to the control circuit board 710.

Then, the upper case 707a and the lower case 707b are positioned as shown in FIG. 14. The upper case 707a is positioned over the lower case 707b in parallel to each other and with a certain space interposed therebetween, because the connector 702 is already mounted on the lower case 707b. Then, the flexible printed-circuit sheet 704 is placed over both circuit boards 710, 720 as shown in FIG. 14. Both ends of the flexible sheet 704 are pressed down against the terminal portions of both circuit boards 710, 720 by heated jigs S to solder the flexible sheet 704 to the circuit boards 710, 720. More particularly, solder is placed between the flexible sheet 704 and both circuit boards 710, 720 at the positions to be soldered, and the solder is heated by the jigs S and melted.

After the flexible sheet 704 is electrically connected to both circuit boards 710, 720, the upper case 707a is flipped over the lower case 707b, and the both cases 707a, 707b are mechanically connected to each other. Thus, the electronic control unit 700 is completed.

There are following merits in manufacturing the electronic control unit 700. Since all the components are mounted on both circuit boards 710, 720 before both circuit boards are fixed to the upper case 707a, 707b, the process of mounting the components are easily and effectively carried out. Since the flexible sheet 704 is soldered to both circuit boards 710, 720 after both circuit boards are fixed to the cases 707a, 707b, there is no need to prepare a jig holding both circuit boards in the process of soldering the flexible sheet 704. Since all the circuit wires are integrally formed in the single flexible printed-circuit sheet 704, the soldering process is easily carried out without causing misconnections. Since the control circuit board 710 is supported by the supporting portion 714b at the position where the flexible sheet 704 is pressed down, the control circuit board 710 is kept firmly without being deformed in the soldering process, thereby attaining good electrical connections.

Figure 15:
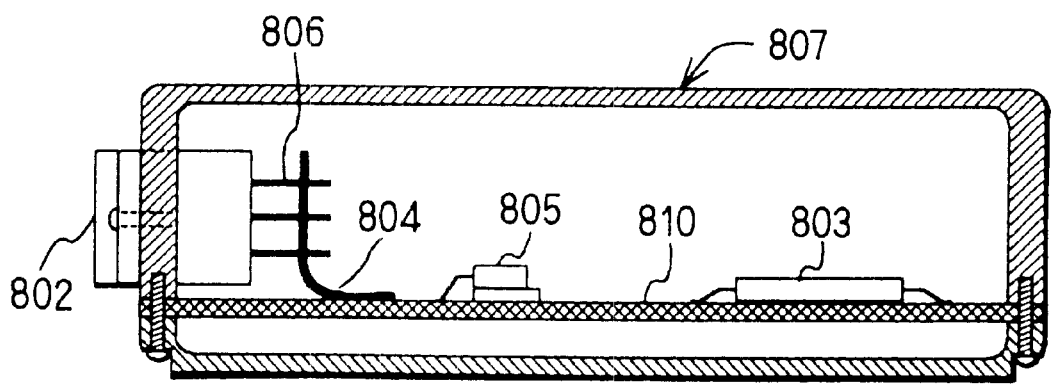
FIG. 15 is a cross-sectional view showing an electronic control unit as a comparative example of an eighth embodiment of the present invention.
Figure 16A:
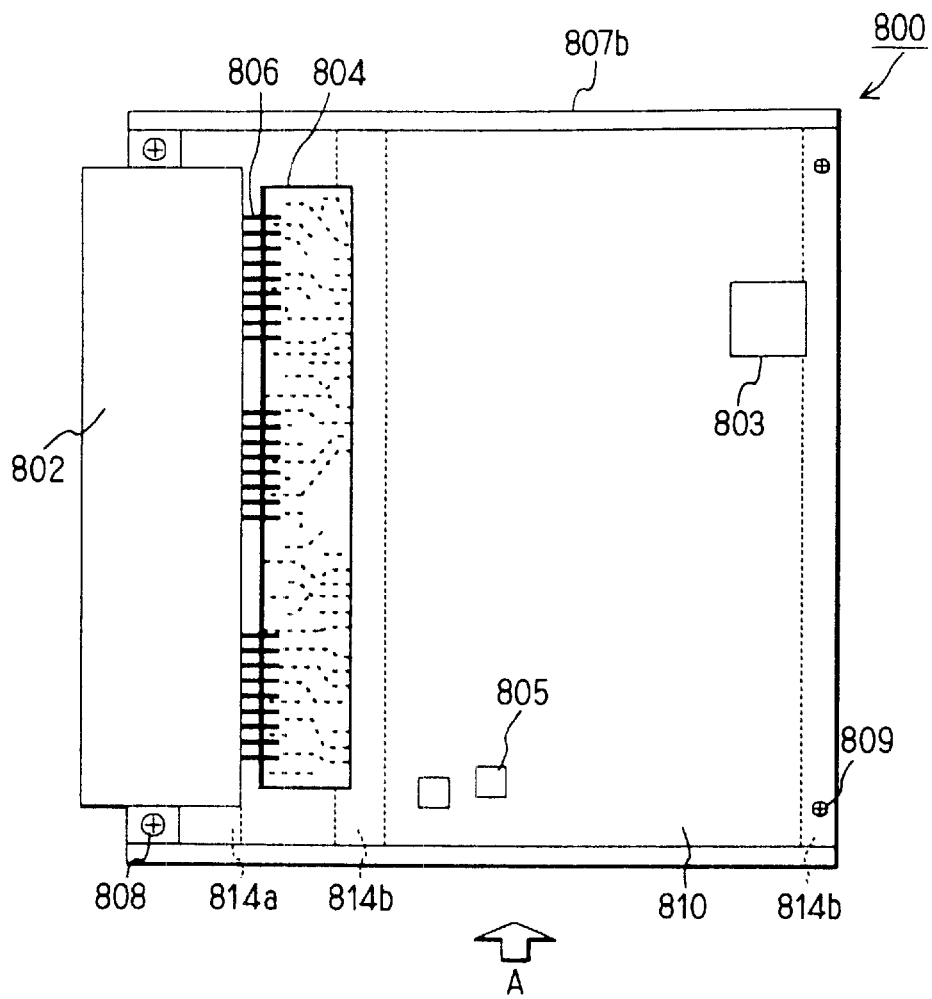
FIG. 16A is a plan view showing the eighth embodiment with its upper case removed.
Figure 16B:
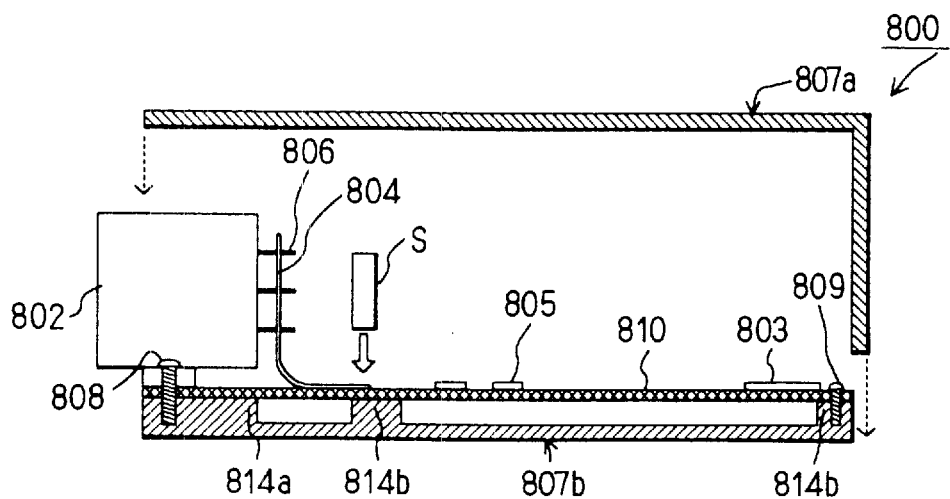
FIG. 16B is a cross-sectional view showing a process of assembling the eighth embodiment, viewed from direction A shown in FIG. 16A.
Figure 17A:
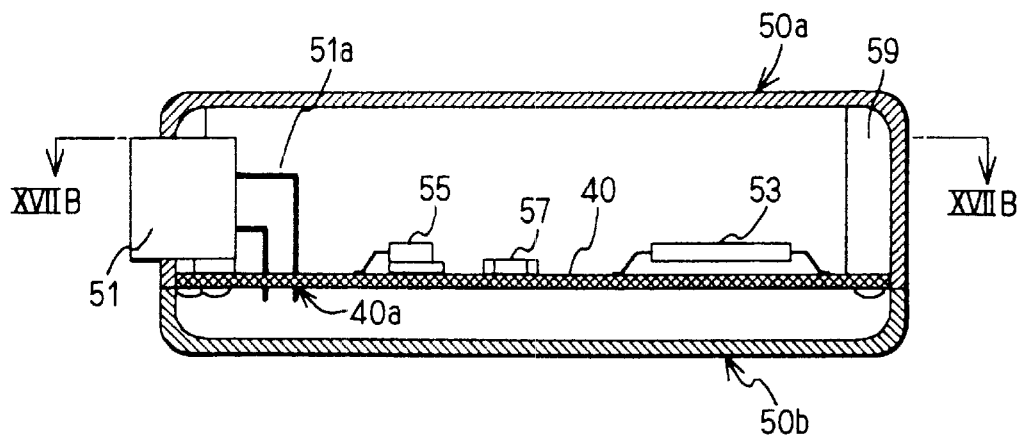
FIG. 17A is a cross-sectional view showing a conventional electronic control unit, taken along line XVIIA—XVIIA of FIG. 17B.
Figure 17B:
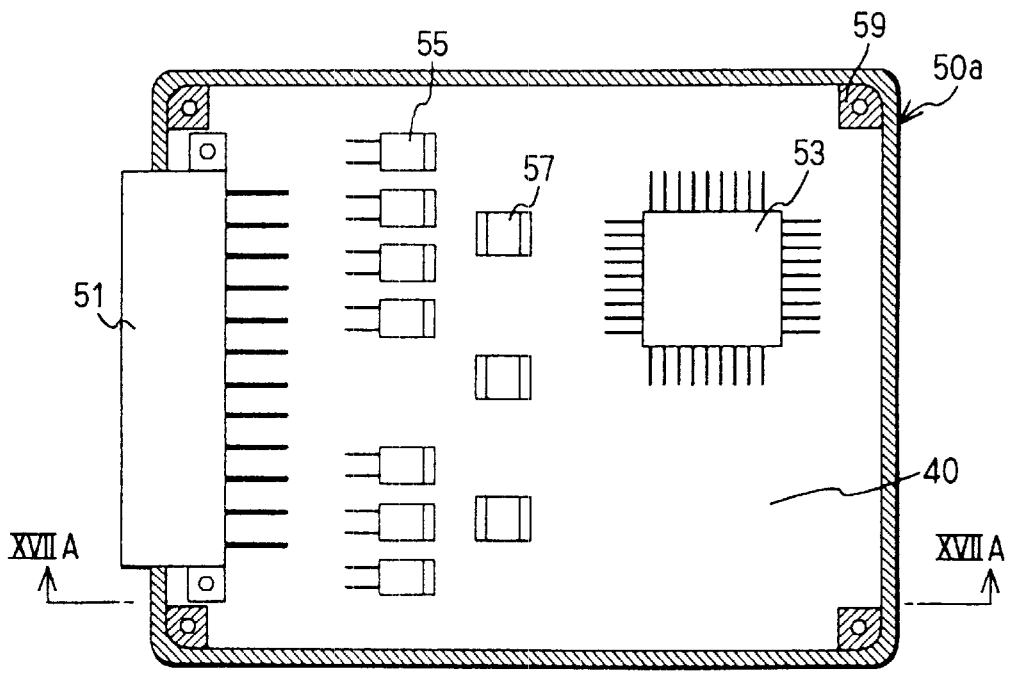
FIG. 17B is a cross-sectional view showing the conventional electronic control unit shown in FIG. 17A, taken along line XVIIB—XVIIB of FIG. 17A.
Figure 18:
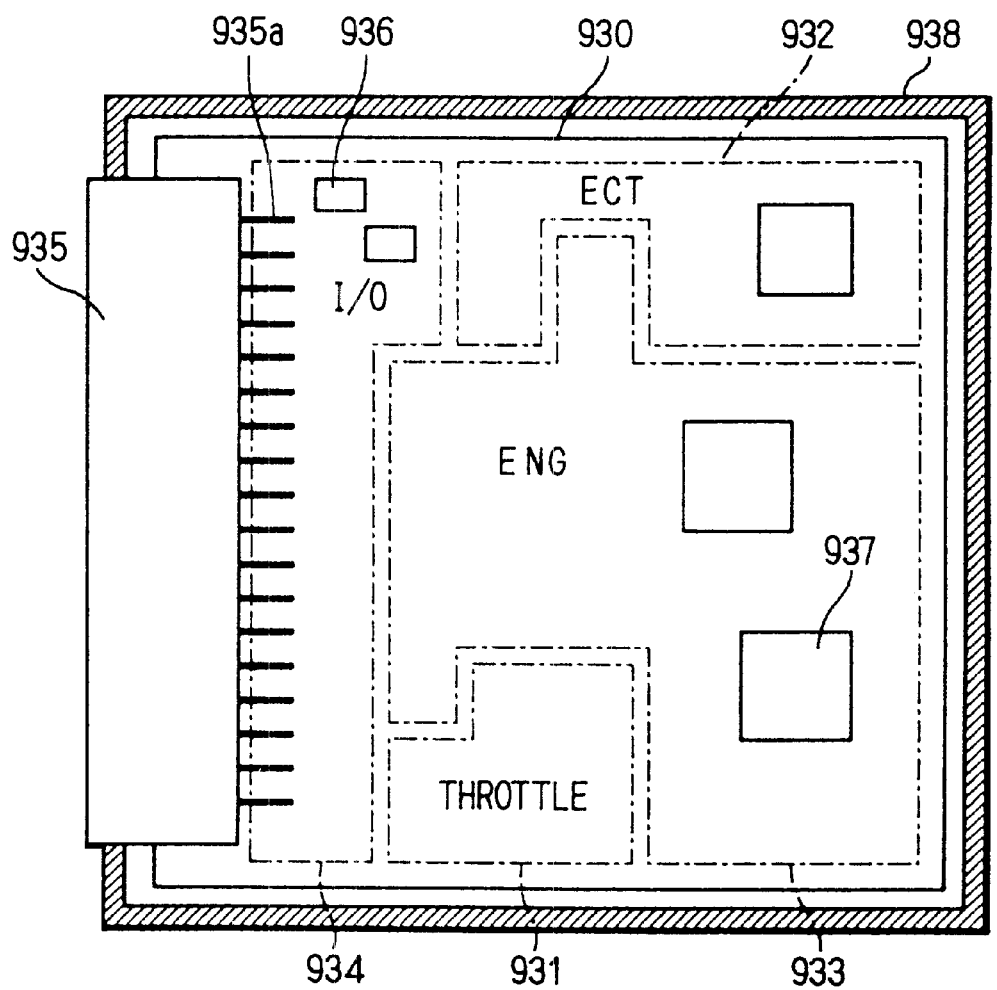
FIG. 18 is a cross-sectional view showing another conventional electronic control unit with its upper case removed.

An eighth embodiment of the present invention will be described with reference to FIGS. 15, 16A and 16B. FIG. 15 briefly shows a comparative example of the eighth embodiment. In this example, a circuit board 810 carrying driving elements 805 and control elements 803 thereon is contained in a casing 807, being supported at both sides thereof. A connector 802 having plural connector pins 806 is fixed to the casing 807. The circuit board 810 and the connector pins 806 are electrically connected through a flexible printed-circuit sheet 804. This structure is advantageous in replacing the connector 802 with another one, because the connector 802 is not directly connected to the circuit board 810 but indirectly connected through the flexible sheet 804. However, since the circuit board 810 is only supported at both sides thereof, it tends to be deformed when pressure is applied thereto in the process of soldering the flexible sheet 804.

An electronic control unit 800 as the eighth embodiment of the present invention includes an additional supporting portion 814b for supporting the circuit board 810. The eighth embodiment will be described with reference to FIGS. 16A and 16B, which show a plan view with an upper case removed and a vertical structure, respectively.

The control unit 800 is similarly used in an automobile as the foregoing embodiments. The control unit 800 is composed of: a casing including an upper case 807a and a lower case 807b; a circuit board 810 mounted on the lower case 807b; a connector 802 also mounted on the lower case 708b; and a flexible printed-circuit sheet 804 electrically connecting the connector 802 to the circuit board 810. The circuit board 810 is made of an epoxy-impregnated glass fiber board, and electronic components such as driving elements 805 and control elements 803 are mounted thereon. The control circuit board 810 is fixed to the lower case 807b by screws 809 and is supported by supporting portions 814a, 814c at its both sides and a supporting portion 814b at a portion where the flexible sheet 804 is soldered.

The connector 802 is fixed to the lower case 807b by screws 808 together with the circuit board 810. One end of the flexible sheet 804 is electrically connected to the connector pins 806, and the other end is electrically connected to a terminal portion of the circuit board 810. The upper case 807a and the lower case 807b are mechanically fixed to each other to form an unitary casing.

The electronic control unit 800 is assembled in the following manner. The electronic components such as the driving elements 805 and the control elements 803 are all mounted on the circuit board 810 and electrically connected to a circuit pattern formed on the circuit board 810. The connector pins 806 are inserted into holes formed on one end of the flexible sheet 804 and soldered thereto. Then, the circuit board 810 and the connector 802 to which the flexible sheet 804 is connected are mounted on and fixed to the lower case 807b by screws 808 and 809. The circuit board 810 is supported by the supporting portions 814a, 814c at both sides thereof and by the supporting portion 814b at the position where the flexible sheet 804 is to be soldered.

Then, the other end of the flexible sheet 804 is soldered to the terminal portion of the circuit board 810. Solder placed between the flexible sheet 804 and the circuit board 810 is melted by the heated jig S pressing down the flexible sheet 804 onto the circuit board 810. Finally, the upper case 807a is fixed to the lower case 707b to form the unitary casing.

Similar advantages as in the seventh embodiment are attained in this embodiment, too. In addition, since the connector 802 is indirectly connected to the circuit board 810 through the flexible printed-circuit sheet 804, various types of the connectors can be selectively used without making a major change in the circuit pattern formed on the circuit board 810. In other words, the connector can be replaced with another one only by changing the circuit pattern in the flexible sheet 804.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An electronic control unit comprising:
    a casing;
    a rectangular circuit board on which electronic components are mounted, the circuit board being contained in the casing; and
    a connector for electrically connecting the electronic control unit to outside devices, the connector having a plurality of connector pins, wherein:
        the circuit board and the connector pins are electrically connected through a flexible printed-circuit sheet;
        the casing includes stepped circuit board support surfaces supporting not only the circuit board, but also at least one other alternative circuit board having a different surface area than the circuit board; and
        each of the supporting surfaces includes means for fixing at least one of the circuit board and the at least one other alternative circuit board thereon in such a manner that all circuit boards capable of being contained in the casing and connected to the connector at an identical distance therefrom.

2. The electronic control unit as in claim 1, wherein:
the electronic components mounted on the circuit board include heat-generating components;
the casing includes a heat-dissipating wall formed therein; and
the heat-generating components are disposed in contact with the heat-dissipating wall.

3. The electronic control unit as in claim 1, wherein:
the circuit board is divided into a plurality of circuit boards, each of which controls a respectively different object.

4. The electronic control unit as in claim 1, wherein:
the circuit board is divided into a plurality of circuit boards, each of which performs a respectively different function.

5. The electronic control unit as in claim 1, wherein:
a signal alignment board is interposed between the connector pins and the flexible printed-circuit sheet, so that the connector pins are electrically connected to the circuit board through the signal alignment board and the flexible printed-circuit sheet, the signal alignment board including a circuit pattern for aligning circuit lines in the flexible printed-circuit sheet all in parallel to one another.

6. The electronic control unit as in claim 15, wherein:
noise-absorbing elements for absorbing noise coming into the electronic control unit from the connector are mounted on the signal alignment board.

7. The electronic control unit as in claim 1, wherein the connector is mounted on the casing.

8. An electronic control unit comprising:
a casing;
a rectangular circuit board on which electronic components are mounted, the circuit board being contained in the casing; and
a connector for electrically connecting the electronic control unit to outside devices, the connector having a plurality of connector pins, wherein:
the circuit board and the connector pins are electrically connected through a flexible printed-circuit sheet;
the casing includes a surface for supporting the circuit board thereon; and
the supporting surface includes means for fixing not only the circuit board, but also other circuit boards each having a different surface area, in a co-planar manner.

9. The electronic control unit as in claim 8, wherein:
the casing includes first supporting portions for supporting the circuit board at both sides thereof and a second supporting portion for supporting the circuit board at a position where the flexible printed-circuit sheet is electrically connected to the circuit board.

10. The electronic control unit as in claim 8, wherein the connector is mounted on the casing.

11. The electronic control unit as in claim 8, wherein:
the electronic components mounted on the circuit board include heat-generating components;
the casing includes a heat-dissipating wall formed therein; and
the heat-generating components are disposed in contact with the heat-dissipating wall.

12. The electronic control unit as in claim 8, wherein:
the circuit board is divided into a plurality of circuit boards, each of which controls a respectively different object.

13. The electronic control unit as in claim 12, wherein:
each of a plurality of circuit boards is connected through the flexible printed-circuit sheet to the connector with an equal distance.

14. The electronic control unit as in claim 8, wherein:
the circuit board is divided into a plurality of circuit boards, each of which performs a respectively different function.

15. The electronic control unit as in claim 14, wherein:
each of a plurality of circuit boards is connected through the flexible printed-circuit sheet to the connector with an equal distance.

16. The electronic control unit as in claim 8, wherein:
a signal alignment board is interposed between the connector pins and the flexible printed-circuit sheet, so that the connector pins are electrically connected to the circuit board through the signal alignment board and the flexible printed-circuit sheet, the signal alignment board including a circuit pattern for aligning circuit lines in the flexible printed-circuit sheet all in parallel to one another.

17. The electronic control unit as in claim 16, wherein:
noise-absorbing elements for absorbing noise coming into the electronic control unit from the connector are amounted on the signal alignment board.

18. An electronic control unit comprising:
a casing;
a connector for electrically connecting the electronic control unit to outside devices, the connector having a plurality of connector pins;
an input circuit board for handling input signals fed from the connector;
a control circuit board for processing the input signals fed from the input circuit board; and
an output circuit board for generating output signals based on signals fed from the control circuit board; wherein:
the casing includes a surface for supporting the input circuit board, the control circuit board and the output circuit board in a co-planar manner;
the input circuit bard and the output circuit board are disposed in the casing so that one side of both circuit boards faces the connector pins;
the control circuit board is disposed in the casing so that one side thereof faces the other side of the input circuit board and the output circuit board; and
the input and output circuit boards are electrically connected to the connector pins through flexible printed-circuit sheets at one side facing the connector pins, and are electrically connected to the control circuit board through flexible printed-circuit sheets at the other side.

19. The electronic control unit as in claim 18, wherein the connector is mounted on the casing.

20. The electronic control unit as in claim 18, wherein:
a signal alignment board is interposed between the connector pins and the flexible printed-circuit sheet, so that the connector pins are electrically connected to the circuit board through the signal alignment board and the flexible printed-circuit sheet, the signal alignment board including a circuit pattern for aligning circuit lines in the flexible printed-circuit sheet all in parallel to one another.

21. The electronic control unit as in claim 20, wherein:

noise-absorbing elements for absorbing noise coming into the electronic control unit from the connector are amounted on the signal alignment board.

22. The electronic control unit as in claim 18, wherein:

the input circuit board and the output circuit board are connected through the flexible printed-circuit sheets to the connector with an equal distance.

23. A method of manufacturing an electronic control unit having a casing composed of an upper case and a lower case, a first circuit board carrying electronic components thereon, a second circuit board carrying electronic components thereon, a connector for electrically connecting the electronic control unit to outside devices, and a flexible printed-circuit sheet connecting the first circuit board and the second circuit board, the method comprising:

mounting the first circuit board on the upper case;

mounting the second circuit board and the connector on the lower case;

electrically connecting one end of the flexible printed-circuit sheet directly to a surface of the first circuit board;

electrically connecting the other end of the flexible printed-circuit sheet directly to a surface of the second circuit board at a position where the second circuit board is supported by the lower case; and mechanically connecting the upper case and the lower case to form the casing as a single unit.

\* \* \* \* \*